(12) United States Patent
Isozaki et al.

(10) Patent No.: US 8,351,115 B2
(45) Date of Patent: Jan. 8, 2013

(54) COMPLEX TYPE MICROSCOPIC DEVICE

(75) Inventors: Hisashi Isozaki, Tokyo (JP); Fumio Ohtomo, Tokyo (JP); Kazuo Nunokawa, Tokyo (JP)

(73) Assignee: Kabushiki Kaisha TOPCON, Tokyo (JP)

( * ) Notice: Subject to any disclaimer, the term of this patent is extended or adjusted under 35 U.S.C. 154(b) by 733 days.

(21) Appl. No.: 12/588,387

(22) Filed: Oct. 14, 2009

(65) Prior Publication Data
US 2010/0091362 A1   Apr. 15, 2010

(30) Foreign Application Priority Data
Oct. 15, 2008   (JP) .................. 2008-266475

(51) Int. Cl.
*G02B 21/36* (2006.01)
(52) U.S. Cl. .......... 359/363; 359/368; 250/311
(58) Field of Classification Search .......... 250/306–311; 850/8–9; 359/368, 369, 372–384, 392, 393
See application file for complete search history.

(56) References Cited

U.S. PATENT DOCUMENTS
7,214,937 B2 * 5/2007 Abe et al. .................. 250/311

FOREIGN PATENT DOCUMENTS
JP    6-308039    11/1994
JP   2004-319518  11/2004

* cited by examiner

*Primary Examiner* — Stephone Allen
*Assistant Examiner* — Tamara Y Washington
(74) *Attorney, Agent, or Firm* — Wenderoth, Lind & Ponack, L.L.P.

(57) ABSTRACT

A complex type microscopic device includes a slider unit moving a stage, an optical microscope, a scanning electron microscope with an electron axis intersecting with an optical axis of the optical microscope, an optical measurement/observation unit having a magnification between those of the scanning electron microscope and the optical microscope and co-using an objective lens with the optical microscope, and a control unit controlling the entire device, and a display unit having a display screen. During display of a low-magnification optical microscopic image, the control unit controls the display unit to display, on the image, a representation to designate an area to be observed at a magnification of the optical measurement/observation unit, and to display, on the image, another representation to designate an area to be observed at a magnification of the scanning electron microscope during display of a high-magnification optical microscopic image.

9 Claims, 15 Drawing Sheets

COMPLEX TYPE MICROSCOPIC DEVICE

CROSS REFERENCE TO RELATED APPLICATION

The present application is based on and claims priority from Japanese Patent Application No. 2008-266475, filed on Oct. 15, 2008, the disclosure of which is hereby incorporated by reference in its entirety.

BACKGROUND OF THE INVENTION

1. Field of the Invention

The present invention relates to a complex type microscopic device incorporating a scanning electron microscope, and in particular to one which comprises a scanning electron microscope and a microscope having a different magnification but the same observing point from/as those of the scanning electron microscope.

2. Description of the Related Art

A complex type microscopic device for observing a part of an extremely minute sample has been known. For example, Japanese Unexamined Patent Application Publication No. Hei 06-308039 discloses a complex type microscopic device which comprises a foreign particle examining unit to observe a minute sample, a scanning electron microscope to observe a part of the sample, and a moving mechanism moving a stage on which a sample is placed between the optical axis of the examining device and the electron axis of the scanning electron microscope. Such a microscopic device has to make a position where a sample is observed with the examining device coincide with a position where the sample is observed with the scanning electron microscope, so that it needs to include a moving mechanism which can move the stage between two distant points on the optical axis and on the electron axis at such a great accuracy equivalent to a magnification of the scanning electron microscope. However, it is almost impossible to realize such a moving mechanism, and it would be extremely expensive even if it were realized.

In view of solving the above problem, another complex type microscopic device has been developed, which is configured to include a scanning electron microscope and an optical microscope with their respective electron axis and optical axis intersecting with each other on the stage. Japanese Unexamined Patent Application Publication No. 2004-319518, for example, discloses such a microscopic device which comprises a scanning electron microscope having an electron axis orthogonal to the stage, an optical microscope having an optical axis intersecting with the electron axis on the stage, a display unit to display magnified images of a sample obtained with the scanning electron microscope and the optical microscope. This microscopic device is configured so that a moving direction of an image from the scanning electron microscope coincides with that of an image from the optical microscope on the display screen relative to an actual moving direction of a sample. Furthermore, this microscopic device includes a light source emitting a laser light whose optical axis coincides with the electron axis of the scanning electron microscope so that an area of the sample observed with the scanning electron microscope can be observed with the optical microscope by optical spots of the laser light.

However, there still remains a problem in the above complex type microscopic device that due to a large difference in magnification between the scanning electron microscope (20,000 to 30,000 times, for example) and the optical microscope (10 to 100 times, for example), in observing the same sample, an image observed at a magnification of the optical microscope and that observed at a magnification of the scanning electron microscope will be tremendously different in size, for example, a minute point of an image observed with the optical microscope will be a very large area when observed with the scanning electronic microscope. Because of this, it is very difficult to properly observe an arbitrary portion of the image from the optical microscope with the scanning electron microscope since the arbitrary portion of the image from the optical microscope cannot be matched with the image of that portion from the scanning electron microscope in size.

SUMMARY OF THE INVENTION

An object of the present invention is to provide a complex type microscopic device which can properly observe, with a scanning electron microscope, an arbitrary position of an image from an optical microscope.

According to one aspect of the present invention, a complex type microscopic device comprises a slider unit which moves, along a horizontal plane, a stage on which a sample is placed; an optical microscope which has an optical axis parallel to a vertical direction in an area in which the stage is moved by the slider unit; a scanning electron microscope which has an electron axis intersecting with the optical axis on the stage; an optical measurement/observation unit having a magnification intermediate between magnifications of the scanning electron microscope and the optical microscope, and co-using an objective lens with the optical microscope; a control unit which generates an image from image data on the sample obtained with each of the optical measurement/observation unit, the scanning electron microscope, and the optical microscope, and which controls the slider unit to move the stage; and a display unit which includes a display screen on which the image is displayed under control of the control unit, wherein during display of a low-magnification optical microscopic image obtained with the optical microscope on the display screen, the control unit controls the display unit to display, on the low-magnification optical microscopic image, a first representation to designate an area to be observed at the magnification of the optical measurement/observation unit; and during display of a high-magnification optical microscopic image obtained with the optical measurement/observation unit on the display screen, the control unit controls the display unit to display, on the high-magnification optical microscopic image, a second representation to designate an area to be observed at the magnification of the scanning electron microscope.

In one features of the above aspect, the control unit controls the slider unit to move the stage by an amount obtained by converting a direction and an interval between two arbitrary points on the display screen into a direction and an interval on the stage.

In other features of the above aspect, the complex type microscopic device further comprises an instruction element with which an arbitrary position on the display screen can be designated and which gives an instruction to switch among the optical microscope, the optical measurement/observation unit, and the scanning electron microscope, wherein during the display of the low-magnification optical microscopic image on the display screen, when an arbitrary position is designated with the instruction element, the control unit controls the display unit to display the first representation on the low-magnification optical microscopic image in such a manner that a center of the first representation is to be the designated position, and when the instruction element instructs to switch the optical microscope to the optical measurement/observation unit, the control unit controls the slider unit to move the stage so that the designated position is located on the optical axis, to display the high-magnification optical microscopic image on the display screen.

In other features of the above aspect, the complex type microscopic device further comprises an instruction element with which an arbitrary position on the display screen can be designated and which gives an instruction to switch among the optical microscope, the optical measurement/observation unit, and the scanning electron microscope, wherein during the display of the high-magnification optical microscopic image on the display screen, when an arbitrary position is designated with the instruction element, the control unit controls the display unit to display the second representation on the high-magnification optical microscopic image in such a manner that a center of the second representation is to be the designated position, and when the instruction element instructs to switch the optical measurement/observation unit to the scanning electron microscope, the control unit controls the slider unit to move the stage so that the designated position is located on the optical axis, to display an electron microscopic image generated with the scanning electron microscope on the display screen.

In other features of the above aspect, during display of the low-magnification optical microscopic image on the display screen, the control unit controls the display unit to display, on the first representation, a third representation to designate an area to be observed at the magnification of the scanning electron microscope in such a manner that the third representation is located at a center of the first representation.

In other features of the above aspect, the complex type microscopic device further comprises a storage unit in which the low and high-magnification optical microscopic images and the electron microscopic image are storable, wherein the control unit allows the low-magnification optical microscopic image displayed on the display screen to be stored in the storage unit, allows the high-magnification optical microscopic image displayed on the display screen to be stored in the storage unit along with positional data of the low-magnification optical microscopic image, and allows the electron microscopic image displayed on the display screen to be stored in the storage unit along with positional data of the low-magnification optical microscopic image and the high-magnification optical microscopic image.

In other aspect of the above aspect, the optical measurement/observation unit is able to measure a height of the sample.

DETAILED DESCRIPTION OF THE PREFERRED EMBODIMENTS

Hereinafter, embodiments of the present invention will be described in detail with reference to the accompanying drawings.

First Embodiment

Figure 1:
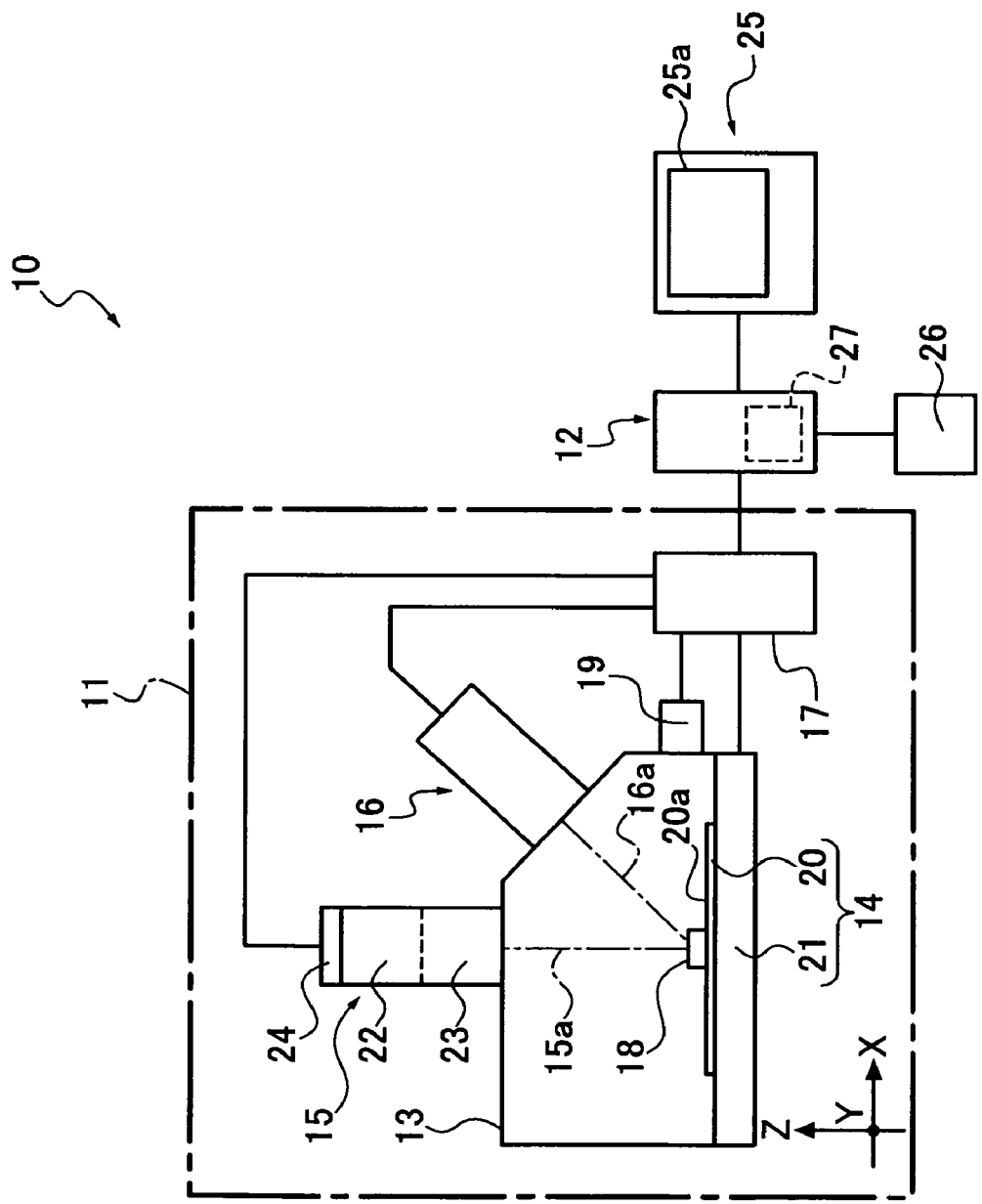
FIG. 1 schematically shows the structure of a complex type microscopic device according to a first embodiment.
Figure 2:
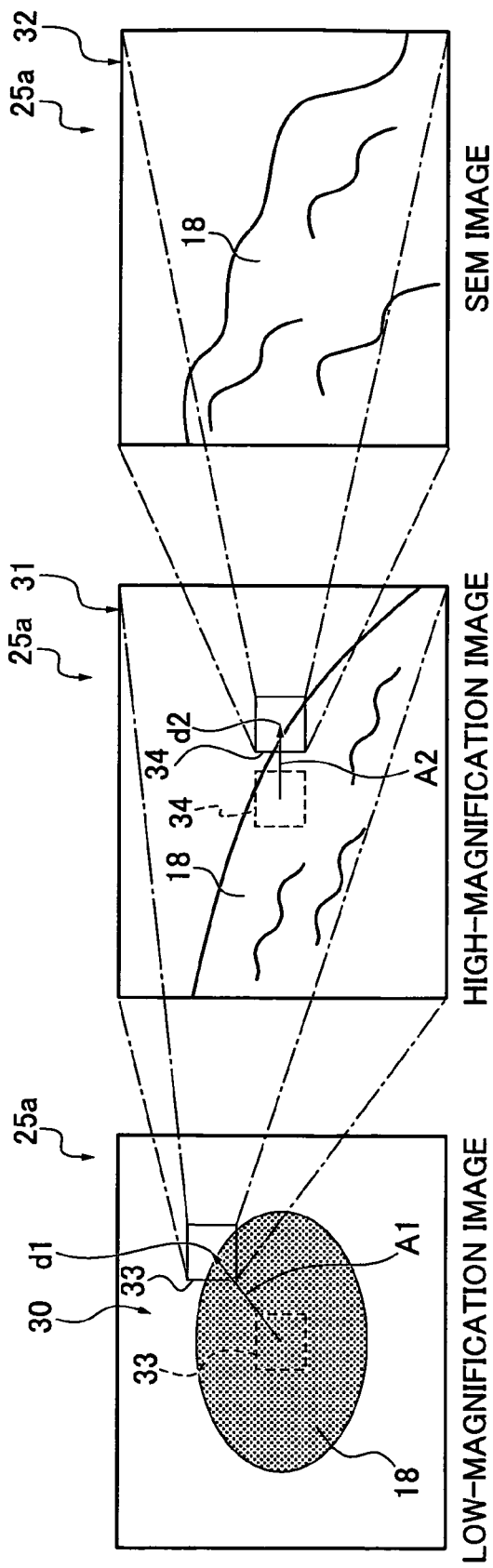
FIG. 2 shows an image on a display screen of the complex type microscopic device and how the image is changed.
Figure 3:
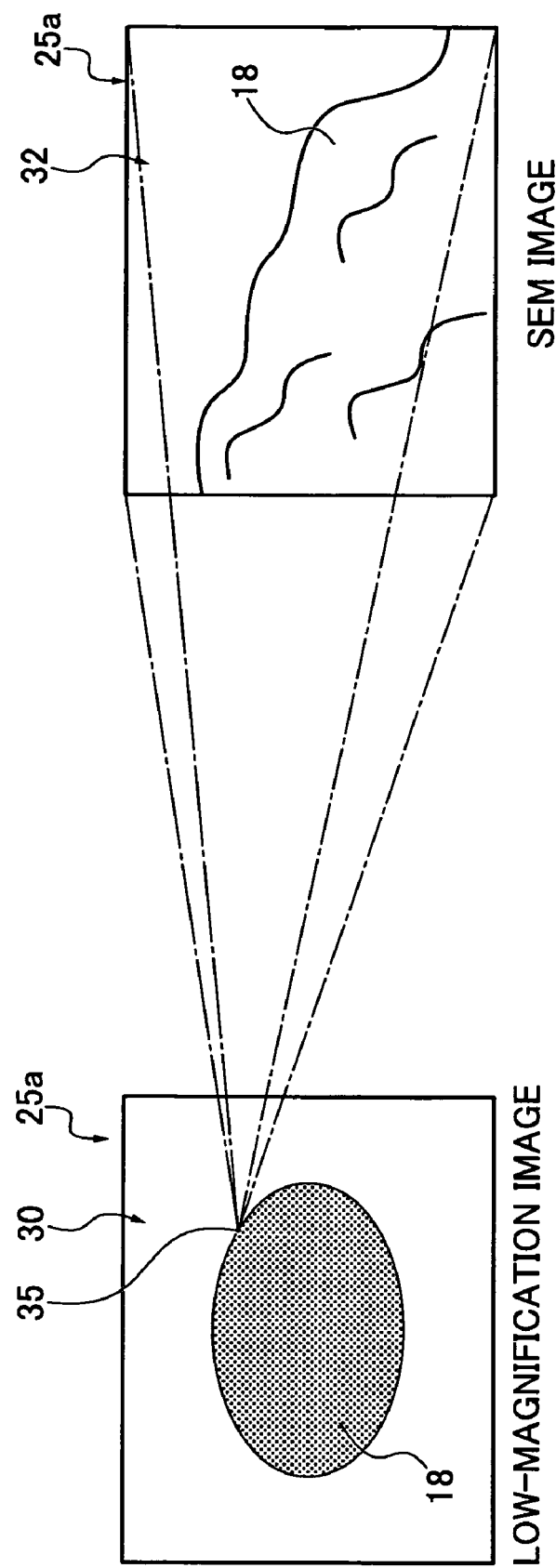
FIG. 3 shows another example of image display and a change of the image display on the display screen.
Figure 4:
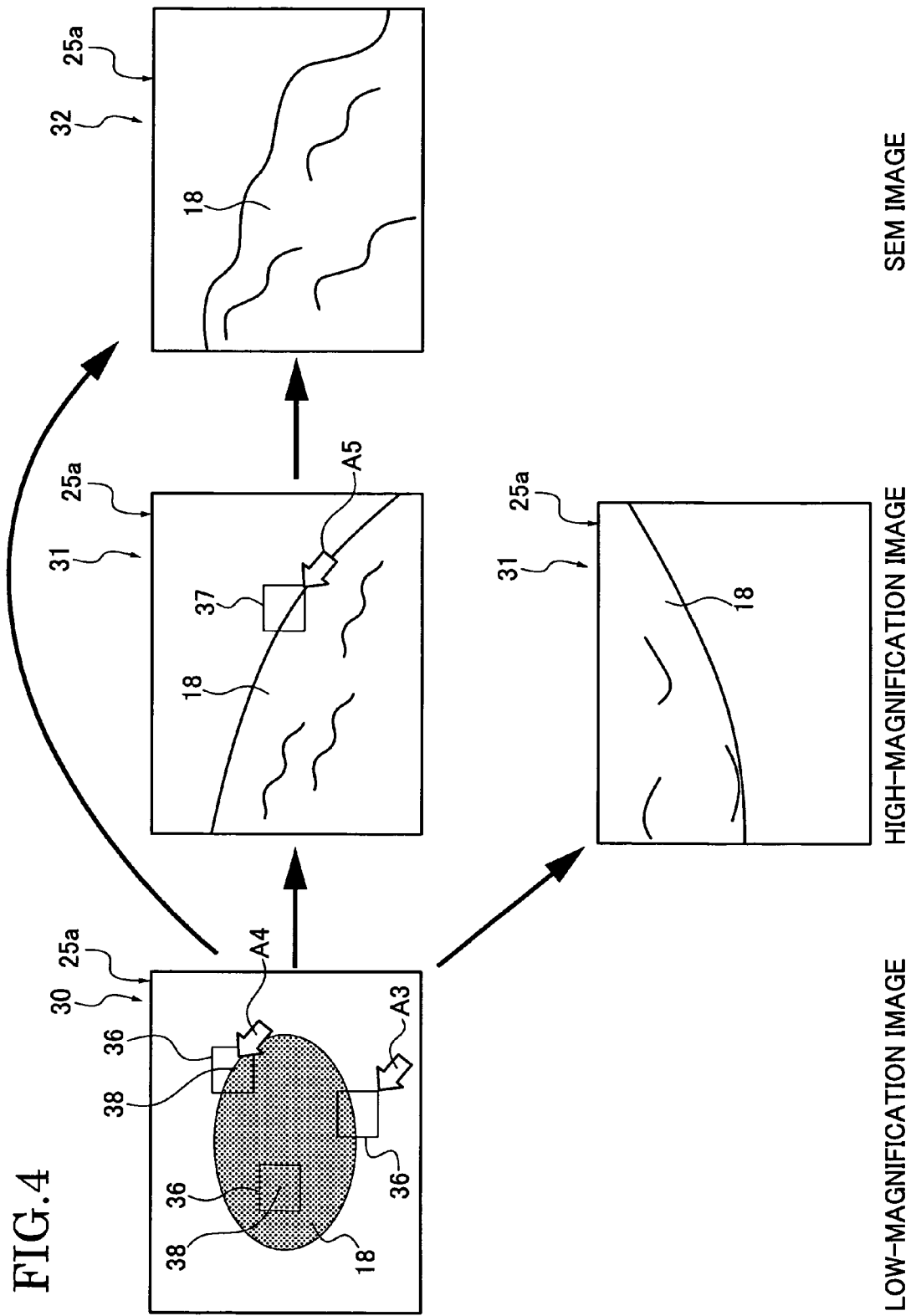
FIG. 4 shows still another example of image display and a change of the image display on the display screen.

First, the basic structure and function of a complex type microscopic device according to the present embodiment will be described with reference to FIGS. 1 to 4. FIG. 1 schematically shows the structure of a complex type microscopic device 10. It is assumed that in FIG. 1, a horizontal direction is an X direction, a direction orthogonal to the X direction is a Y direction, and a direction orthogonal to an XY plane is a Z direction. FIG. 2 shows an image on a display screen 25a of the complex type microscopic device 10 and how the image display is changed. FIG. 3 shows another example of image display and a change of image display on the display screen 25a. FIG. 4 shows still another example of image display and a change of image display on the display screen 25a.

The complex type microscopic device is composed of a main unit 11 and a control unit 12 connected with the main unit 11. The main unit 11 comprises a specimen chamber 13, a slider unit 14, an optical axis 15a, a scanning electron microscope 16 (hereinafter, SEM 16), and a main board 17.

The specimen chamber 13 is a casing to form an air-tight space and includes a not-shown door from/into which a sample 18 is transferred. The air-tightly structured specimen chamber 13 is provided with a vacuum unit 19 which is driven by a control signal from the main board 17 and vacuates the specimen chamber 13. A slider unit 14 is disposed inside the specimen chamber 13.

The slider unit 14 includes a table 20, a stage 20a and a table mover 21. The sample 18 is placed on the stage 20a of the table 20. The table 20 holds the sample 18 on the stage 20a to prevent the sample 18 from being displaced by movement of a table mover 21. The table mover 21 movably supports the stage 20a along the XY plane (horizontal plane) and in the Z direction (vertical direction) while maintaining the stage 20a in parallel with the XY plane. Also, the table mover 21 moves the stage 20a along the XY plane in the Z direction in accordance with a control signal from the main board 17. The slider unit 14 has a not-shown reference position for moving the table 20 (stage 20a) by the table mover 21.

The optical observation system 15 is disposed so that its optical axis 15a passes through the center of the table 20 (stage 20a) as a reference position and is in parallel with the Z direction. The optical observation system 15 is attached not to impair air-tightness of the specimen chamber 13 and is comprised of an optical microscope 22 and an optical measurement/observation unit 23 which share an objective lens 42 (FIG. 8 to FIG. 11) and have the same optical axis 15a.

The optical measurement/observation unit 23 is able to measure the height of the sample 18 (dimension in the Z direction), and it is set to have an intermediate magnification, which is higher than that of the optical microscope 22 and lower than that of the SEM 16. For example, the optical microscope 22 has a magnification of 10 to 100 times, the optical measurement/observation unit 23 has that of about 1,000 times, and the SEM 16 has that of about 10,000 to 30,000 times. The optical measurement/observation unit 23 can be formed of a confocal microscope, a laser microscope, or an interferometer as described later. With the optical microscope 22, optical measurement/observation unit 23, and SEM 16, it is possible to observe the sample 18 (or display image data) with their respective magnifications on the display screen 25a of the display unit 25. Note that the complex type microscopic device according to the first and second embodiments of the present invention is configured that resolution of an image displayed on the display unit is changed in accordance with a change in magnification of the image. Therefore, the term, "magnification" can be replaced with the term, "resolution".

The optical observation system 15 includes a light receiving element 24 to receive reflected light from the sample 18. Image data received with the light receiving element 24 is converted into an electric signal and transmitted to a later-described control unit 12 via a main board 17. A change of magnification of and switching of the optical microscope 22 and optical measurement/observation unit 23 are done by the control signal from the main board 17. The detailed structure of the optical observation system 15 will be described later.

The SEM 16 is attached to the specimen chamber 13 not to impair air-tightness therein and disposed so that its electron axis 16a intersects with the optical axis 15a of the optical observation system 15 at the center of the table 20 (stage 20a) as the reference position. The SEM 16 is inclined at a predetermined angle (about 60° for example) relative to the Z direction. The predetermined angle can be arbitrarily set as long as an electron microscopic image 32 (FIG. 2) of the sample 18 on the stage 20a can be properly obtained or with a positional relation with the optical observation system 15 or else taken into consideration.

The SEM 16 includes an electron gun, a focusing lens (condenser lens), a scanning coil, and an objective lens (not shown), to scan the sample 18 with an electron beam emitted from the electron gun and deflected on the electron axis 16a via the focusing lens, scanning coil, and objective lens, detect an electron, a secondary electron or the like reflected or emitted from the sample 18 with a not-shown detector, and obtain an image of the sample 18. The electron axis 16a of the SEM 16 is a center line of a not-deflected electron beam. The SEM 16 generates an image of the sample 18 based on intensity of the electron beam detected by the detector in the specimen chamber 13. Data on the image is converted into an electric signal and transmitted to the control unit 12 from the main board 17. A change of magnification of and driving of the SEM 16 are done by the control signal from the main board 17.

The main board 17 is electrically connected with the optical observation system 15, SEM 16, slider unit 14 and vacuum unit 19 to transmit the control signal to drive them. It is also connected with the control unit 12.

The control unit 12 is connected at least with the display unit 25 and an operation unit (instruction element) 26. The display unit 25 includes the display screen 25a and is controlled by the control unit 12. Images obtained with the optical observation system 15 (optical microscope 22 and optical measurement/observation unit 23) and the SEM 16 are displayed on the display screen 25a when needed.

The operation unit 26 is manipulated to operate the complex type microscopic device 10 and a manipulation with the unit is read by the control unit 12. By manipulating the operation unit 26, various operations can be done such as display and moving of later-described representations (numeric codes 33, 34, 35 in FIG. 2 and FIG. 3) to designate areas of images, switching and magnification adjustment of the optical microscope 22, optical measurement/observation unit 23, and SEM 16.

The control unit 12 functions to collectively control the display unit and the main unit 11 and transmit control signals to the main board 17 to control the respective elements of the main unit 11. Also, it controls the display unit 25 to display images from the optical observation system 15 (low-magnification optical microscopic image 30 and high-magnification optical microscopic image 31 in FIG. 2) and images from the SEM 16 (electron microscopic image (hereinafter, SEM image) 32 in FIG. 2) as well as to display the representations on the images on the display screen 25a.

The representations to designate display areas are a low-magnification frame 33 (FIG. 2), a high-magnification frame 34 (FIG. 2), and an SEM point 35 (FIG. 3). The low-magnification frame 33 is to designate, during display of a low-magnification optical microscopic image (hereinafter, low-magnification image) 30 from the optical microscope 22, an area to display an image captured at a magnification of the optical measurement/observation unit 23. That is, the low-magnification frame 33 is to indicate, on the low-magnification image 30, a size of an area to be able to display a high-magnification optical microscopic image (hereinafter, high-magnification image) from the optical measurement/observation unit 23 on the display screen 25a at once, as shown in FIG. 2. Note that the high-magnification image is an image measured with the optical measurement/observation unit 23.

The high-magnification frame 34 is to designate, during display of the high-magnification image 31 from the optical measurement/observation unit 23, an area to display an image captured at a magnification of the SEM 16. That is, the high-magnification frame 34 is to indicate, on the high-magnification image 31, a size of an area to be able to display an image captured with the SEM 16 on the display screen 25a at once, as shown in FIG. 2.

The SEM point 35 is to designate, during display of the low-magnification image 30 from the optical microscope 22, an area to display an image captured at a magnification of the SEM 16 on the display screen 25a. That is, the SEM point 35 is to indicate, on the high-magnification image 31, a size of an area to be able to display an image captured with the SEM 16 at once the display screen 25a, as shown in FIG. 3.

Further, the control unit 12 includes a storage 27 which can store, under the control of the control unit 12, image data as the low-magnification image 30, high-magnification image 31, and electron microscopic image 32 displayed on the display screen 25a as well as positional data on the respective images. Image data can be stored in the storage 27 in response to a manipulation with the operation unit 26 or all the images displayed on the display screen 25a can be stored therein.

Moreover, when an image associated with the image being displayed on the display screen 25a is stored in the storage 27, the control unit 12 allows the display unit 25 to display an associated low-magnification frame 36, an associated high-magnification frame 37, and an associated SEM point 38 on the image at respective positions in accordance with positions of the stored image. According to the present embodiment, the associated low-magnification frame 36, associated high-magnification frame 37, and associated SEM point 38 are the same as the low-magnification frame 33, high-magnification frame 34, and SEM point 35 to designate an area to be displayed, respectively. Preferably, they can be displayed in different colors so that they can be visually distinctive, for example.

In the present embodiment, the control unit 12 is composed of a computer in which a software program for controlling the main unit 11 of the microscopic device 10 is installed, the display unit 25 is composed of a monitor, and the operation unit 26 can be any pointing device connected to the computer such as a mouse or arrow keys on a keyboard.

Figure 5:
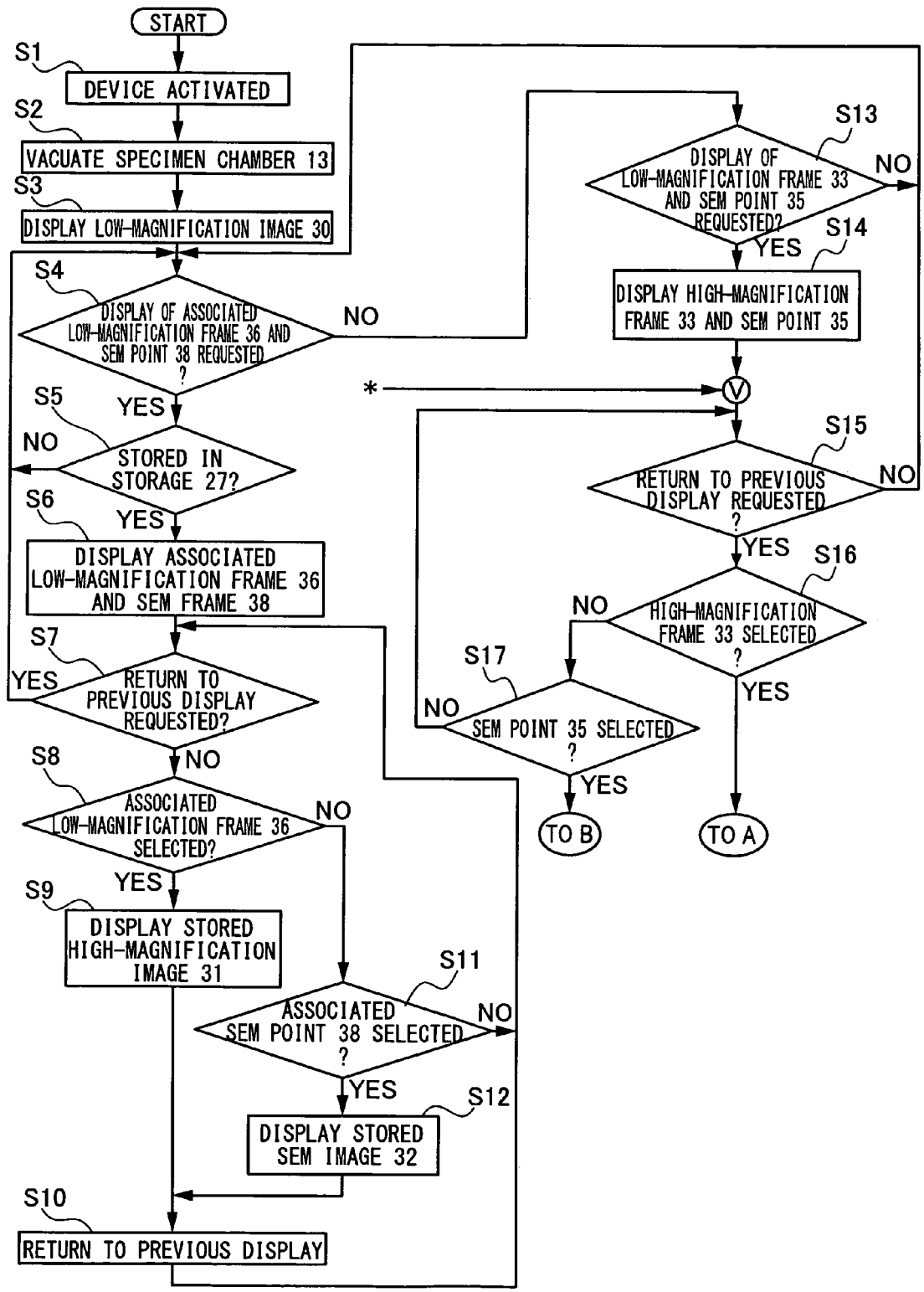
FIG. 5 is a flowchart to observe a sample with an optical microscope.
Figure 6:
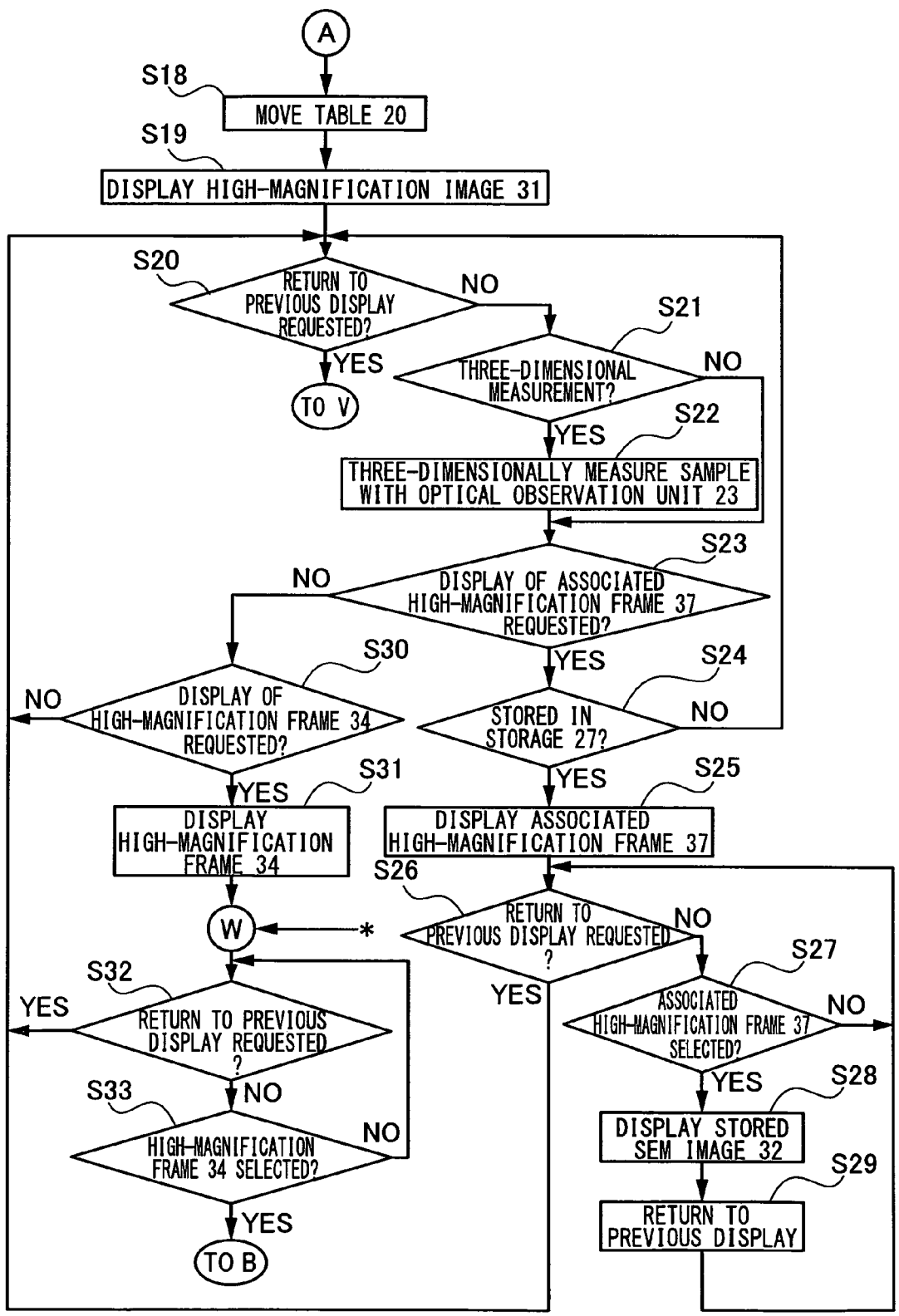
FIG. 6 is a continuation of the flowchart in FIG. 5 to observe a sample with an optical measurement/observation unit.
Figure 7:
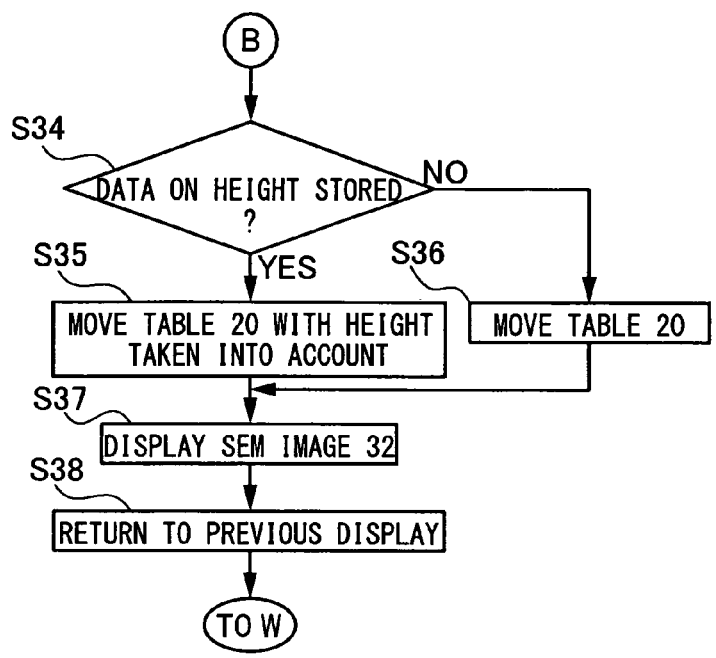
FIG. 7 is a continuation of the flowchart in FIG. 6 to observe a sample with a scanning electron microscope.

Next, the control process of the complex type microscopic device 10 will be described with reference to flowcharts in FIG. 5 to FIG. 7. FIG. 5 shows an example of observing a sample with the optical microscope 22, FIG. 6 is a continuation of FIG. 5 to observe a sample with the optical measurement/observation unit 23, and FIG. 7 is a continuation of FIG. 6 to observe a sample with the SEM 16.

In step S1 in FIG. 5, the complex type microscopic device 10 is brought into an operation state in response to a boosting operation, and the control unit 12 drives the slider unit 14 of the specimen chamber 13 to move the table 20 (stage 20a) to the reference position. With use of a computer incorporating a software program as the control unit 12, the device 10 becomes activated upon turning on the computer and boosting the program. Then, the control unit 12 allows the display unit 25 to display on the display screen 25a icons for terminating an observation, for completing sample settings, and for returning to a previous screen display. The icons for terminating an observation and for completing settings are continuously displayed while the complex type microscopic device 10 is in operation. Upon receiving signals according to a manipulation to the icon with the operation unit 26, the control unit 12 terminates the observation or allows the display unit 25 to return to the previous display on the display screen 25a. Upon receiving a signal to complete sample settings, the control unit 12 proceeds to step S2. The settings refer to properly placing the sample 18 on the stage 20a.

In step S2 the control unit 12 drives the vacuum unit 19 to vacuate the specimen chamber 13 after confirming that the sample 18 is securely held on the stage 20a and the door of the specimen chamber 13 is closed.

In step S3 the control unit 12 allows the low-magnification image from the optical microscope 22 to be displayed on the display screen 25a (FIG. 2) and proceeds to step S4. The low-magnification image 30 can be displayed on the display screen 25a even during the vacuum of the specimen chamber 13. Then, the control unit 12 allows not-shown three icons for storing the low-magnification image 30, for displaying the low-magnification frame 33 and SEM point 35, and for displaying the associated low-magnification frame 36 and associated SEM point 38 to be displayed on the display screen 25a. Upon receiving a signal to store an image, the control unit 12 allows the low-magnification image 30 on the display screen 25a to be stored in the storage 27.

In step S4 the control unit 12 determines whether or not the icon has been manipulated to display the associated low-magnification frame 36 and the associated SEM point 38. When a result is positive, it proceeds to step S5 while when the result is negative, it proceeds to step S13.

In step S5 the control unit 12 determines whether or not the high-magnification image 31 or SEM image 32 associated with a currently displayed low-magnification image 30 is stored in the storage 27. With a positive result, it proceeds to step S6 while with a negative result, it returns to step S4. In the present embodiment, returning to step S4, the control unit 12 controls the display unit 25 to display a message on the display screen 25a that neither the associated high-magnification image 31 nor SEM image 32 is stored.

In step S6, the control unit 12 allows the associated low-magnification frame 36 to be superimposed on the displayed low-magnification image 30 based on positional data of the stored high-magnification image 31, and the associated SEM point 38 to be superimposed thereon based on positional data of the stored SEM image 32 (FIG. 4).

In step S7 the control unit 12 determines whether or not the icon is manipulated with the operation unit 26 to return the screen display to the previous one. With a positive result, the display on the display screen 25a is returned to the previous one (without display of the associated low-magnification frame 36 and associated SEM point 38), and the control unit 12 goes back to step S4. With a negative result, it proceeds to step S8.

In step S8 the control unit 12 determines whether or not the associated low-magnification frame 36 on display is selected. With a positive result (see the arrow A3 in FIG. 4), it proceeds to step S9 while with a negative result, it proceeds to step S11.

In step S9 the control unit 12 reads a portion of the high-magnification image 31 from the storage 27 in accordance with positional data of the selected associated low-magnification frame 36 and allows it to be displayed on the display screen 25a (FIG. 4).

In step S10 the control unit 12 maintains the display on the display screen 25a until it receives the signal to return the screen display to the previous one, and allows it to display the previous display (with display of the associated low-magnification frame 36 and SEM point 38 on the low-magnification image 30). Then, it returns to step S7.

In step S11 the control unit 12 determines whether or not the associated SEM point 38 on display is selected. With a positive result (see the arrow A4 in FIG. 4), it proceeds to step S12 while with a negative result, it returns to step S7.

In step S12 the control unit 12 reads a portion of the SEM image 32 from the storage 27 in accordance with positional data of the selected associated SEM point 38 and allows it to be displayed on the display screen 25a (FIG. 4). Then, it returns to step S10.

In step S13 the control unit 12 determines whether or not a manipulation is made to display the low-magnification frame 33 and SEM point 35. With a positive result, it proceeds to step S14 while with a negative result, it returns to step S4. Alternatively, this step can be configured that only either the low-magnification frame 33 or the SEM point 35 can be selected.

In step S14, the control unit 12 allows the low-magnification frame 33 and the SEM point 35 to be displayed on the low-magnification image 30 on the display screen 25a (FIG. 2 and FIG. 3). Then, when receiving an instruction to move the low-magnification frame 33 to an arbitrary position (hereinafter, designated position d1) on the low-magnification image 30 via the operation unit 26, the control unit 12 moves the low-magnification frame 33 and the SEM point 35 so that the designated position d1 is to be the center of the frame 33 (the arrow A1 in FIG. 2). This operation is done by moving the icon designating the position on the display screen 25*a*. The control unit 12 proceeds to step S15.

In step S15 the control unit 12 determines whether or not the icon is manipulated to return the screen display to the previous one (without display of the low-magnification frame 33 and SEM point 35). With a positive result, the control unit 12 returns the screen display to the previous one and returns to step S4 while with a negative result, it proceeds to step S16.

In step S16 the control unit 12 determines whether or not the displayed low-magnification frame 33 has been selected. When it has been selected, it proceeds to process A in FIG. 6 (observation with the optical measurement/observation unit 23), and when it has not been selected, it proceeds to step S17. Thus, by selecting the low-magnification frame 33, the optical microscope 22 is switched to the optical measurement/observation unit 23 and the area to be observed on the display screen is the area surrounded by the low-magnification frame 33.

In step S17, the control unit 12 determines whether or not the displayed SEM point 35 has been selected. When it has been selected, it proceeds to process B in FIG. 7 (observation with the SEM 16), and when it has not been selected, it returns to step S15. Thus, by selecting the SEM point 35, the optical microscope 22 is switched to the SEM 16 and the area to be observed on the display screen is the area designated by the SEM point 35.

Now, the observation with the optical measurement/observation unit 23 will be described referring to FIG. 6.

In step S18 the control unit 12 moves the table 20 (stage 20*a*) in order to display, on the entire display screen 25*a*, the high-magnification image 31, from the optical measurement/observation unit 23, of the area designated by the low-magnification frame 33. That is, the control unit 12 transmits a control signal to the main board 17 to drive the slider unit 14 of the main unit 11 based on a distance (the arrow A1 in FIG. 2) between the center of the low-magnification image 30 on the display screen 25*a* and the designated position d1 (center of the displayed low-magnification frame 33) so that the designated position d1 is to be located on the optical axis 15*a*. Also, the control unit 12 transmits a control signal to the main board 17 to switch the optical microscope 22 to the optical measurement/observation unit 23. By these control signals, the slider unit 14 moves the table 20 so that the designated position d1 is located on the optical axis 15*a*. Then, it proceeds to step S19.

In step S19 the control unit 12 allows the high-magnification image 31 from the optical measurement/observation unit 23 to be displayed on the display screen 25*a* (FIG. 2), and it proceeds to step S20. This high-magnification image 31 is an image of an area with the center as the designated position d1. The control unit 12 allows the display screen 25*a* to display four different icons for storing the high-magnification image 31, for measuring the height of the sample 18 (dimension in the Z direction) with the optical measurement/observation unit 23, for displaying the high-magnification frame 34, and for displaying the associated high-magnification frame 37 (not shown). The control unit 12 allows the high-magnification image 31 displayed on the display screen 25*a* to be stored in the storage 27, receiving a signal to store it. Thus, by comparing the stored high-magnification and low-magnification images 30, 31, the control unit 12 allows an area of the low-magnification image 30 to be displayed on the display screen in association with the previously displayed area of the high-magnification image 31, using the associated high-magnification frame 37.

In step S20 the control unit 12 determines whether or not the icon has been manipulated with the operation unit 26 to return the screen display to the previous one. With a positive result, it returns the display on the display screen to the previous one (with display of the low-magnification frame 33, SEM point 35 on the low-magnification image 30), and it returns to process V in FIG. 5. With a negative result, it proceeds to step S21.

In step S21 the control unit 12 determines whether or not a manipulation has been made to measure the height of the sample 18 (dimension in the Z direction) with the optical measurement/observation unit 23. With a positive result, it proceeds to step S22, while with a negative result, it proceeds to step S23.

In step S22 the control unit 12 controls the optical measurement/observation unit 23 to measure the height of the sample 18. That is, the optical measurement/observation unit 23 three-dimensionally observes the sample 18 to acquire three-dimensional image data. Then, the control unit 12 stores data on the height contained in the high-magnification image 31 in the storage 27 together with data on the high-magnification image 31. Thereafter, it proceeds to step S23.

In step S23 the control unit 12 determines whether or not a manipulation has been made to display the associated high-magnification frame 37. With a positive result, it proceeds to step S24 and with a negative result, it proceeds to step S30.

In step S24 the control unit 12 determines whether or not an SEM image 32 associated with the currently displayed high-magnification image 31 is stored in the storage 27. With a positive result, it proceeds to step S25, and with a negative result, it returns to step S20. In the present embodiment, returning to step S20, the control unit 12 allows the display unit 25 to display a message that no associated SEM image 32 is stored on the display screen 25*a*.

In step S 25 the control unit 12 allows the associated high-magnification frame 37 to be displayed on the high-magnification image 31 on the display screen 25*a* based on positional data of the stored SEM image 32 (FIG. 4).

In step S26 the control unit 12 determines whether or not the icon has been manipulated to return the screen display to the previous one. With a positive result, it controls the display unit to return to the previous screen display (without display of the associated high-magnification frame 37 on the high-magnification image 31), and it returns to step S20. With a negative result, it proceeds to step S27.

In step S27, the control unit 12 determines whether or not the associated high-magnification frame 37 on display has been selected. When it has been selected (the arrow A5 in FIG. 4), it proceeds to step S28 while when it has not been selected, it returns to step S26.

In step S28 the control unit 12 reads a portion of the SEM image 32 from the storage 27 in accordance with the positional data of the selected associated high-magnification frame 37 and displays it on the display screen 25*a* (FIG. 4).

In step S29, the control unit 12 maintains the screen display, and upon receiving the signal to return to the previous display, it allows it to return to the previous one (display of the associated high-magnification frame 37 on the high-magnification image 31), and returns to step S 26.

In step S30, the control unit 12 determines whether or not a manipulation has been made to display the high-magnification frame 34. With a positive result, it proceeds to step S31 while with a negative result, it proceeds to step S20.

In step S31 the control unit 12 allows the display unit 25 to display the high-magnification frame 34 on the high-magnification image 31 on the display screen 25*a* (FIG. 2). When an arbitrary position (designated position d2) is designated on the high-magnification image 31 via the operation unit 26, the control unit 12 moves the high-magnification frame 34 so that the designated position d2 is to be the center of the high-magnification frame 34 (the arrow A2 in FIG. 2). In the present embodiment this operation is done by moving the icon on the display screen 25a with the operation unit 26.

In step S32 the control unit 12 determines whether or not the icon has been manipulated to return the screen display to the previous one. With a positive result, the control unit 12 allows it to return to the previous one (without display of the high-magnification frame 34 on the high-magnification image 31), and returns to step S20, while with a negative result, it proceeds to step S33.

In step S33 the control unit 12 determines whether or not the high-magnification frame 34 has been selected. When it has been selected, it proceeds to process B (observation by the SEM 16), and when it has not been selected, it returns to step S32. That is, by selecting the high-magnification frame 34, the optical measurement/observation unit 23 is switched to the SEM 16 and the area to be observed on the display screen is the area surrounded by the high-magnification frame 34.

Now, the sample 18 is observed with the SEM 16 (process B in FIG. 7).

In step S34 the control unit 12 determines whether or not data on the height of the sample 18 relative to the high-magnification image 31 displayed on the display screen 25a is stored in the storage 27. With a positive result, it proceeds to step S35 while with a negative result, it proceeds to step S36.

In step S35 the control unit 12 moves the table 20 (stage 20a) to observe the area inside the high-magnification frame 34 with the SEM 16 and display an SEM image 32 on the display screen 25a. That is, based on a distance (the arrow A2 in FIG. 2) between the center of the high-magnification image 31 and the designated position d2 (center of the high-magnification frame 34), the control unit 12 transmits a control signal for driving the slider unit 14 of the main unit 11 to the main board 17 so that the designated position d2 is located on the electron axis 16a of the SEM 16. It also transmits a control signal for switching the optical measurement/observation unit 23 to the SEM 16 to the main board 17. Here, the control unit 12 also moves the stage 20a in the Z direction with the dimension of the sample 18 in the Z direction (height from the stage 20a) at the designated position d2 taken into account. Accordingly, the slider unit 14 can properly move the stage 20a so that the designated position d2 of the sample 18 is located on the electron axis 16a.

In step S36 the control unit 12 moves the table 20 (stage 20a) to observe the area inside the high-magnification frame 34 with the SEM 16 and display an SEM image 32 on the display screen 25a. That is, based on a distance between the center of the high-magnification image 31 and the designated position d2 (center of the displayed high-magnification frame 34), the control unit 12 transmits a control signal for driving the slider unit 14 of the main unit 11 to the main board 17 so that the designated position d2 is located on the electron axis 16a of the SEM 16. It also transmits a control signal for switching the optical measurement/observation unit 23 to the SEM 16 to the main board 17. Accordingly, the slider unit 14 can properly move the stage 20a so that the designated position d2 of the sample 18 is located on the electron axis 16a.

In step S37 the control unit 12 allows the SEM image 32 from the SEM 16 to be displayed on the display screen 25a (FIG. 2), and proceeds to step S38. The SEM image 32 is an image of the area whose center is at the designated position d2. Then, the control unit 12 allows the icon for storing the SEM image 32 (not shown) to be displayed on the display screen 25a. Upon receiving a signal for storing the image, the control unit 12 stores the SEM image 32 on the display screen 25a in the storage 27. Thus, the control unit 12 allows an area of the SEC image 32 to be displayed on the display screen in association with the previously displayed area of the low-magnification or high-magnification image 30, 31, using the associated high-magnification frame 37 or SEM point 38. When the stored high-magnification image 31 is accompanied with the data on the height of the sample 18, the SEM image 32 is stored together with this data in the storage 27.

In step S38 the control unit 12 maintains the screen display on the display screen 25a, and upon receiving the signal to return to the previous display, it allows it to return to the previous one (with display of the low-magnification frame 33 on the high-magnification image 31). Then, it returns to process W (FIG. 6).

Next, an example of the structure of the optical observation system 15 will be described. A description on the slider unit 14 and the SEM 16 will be omitted since it has been made above.

Figure 8:
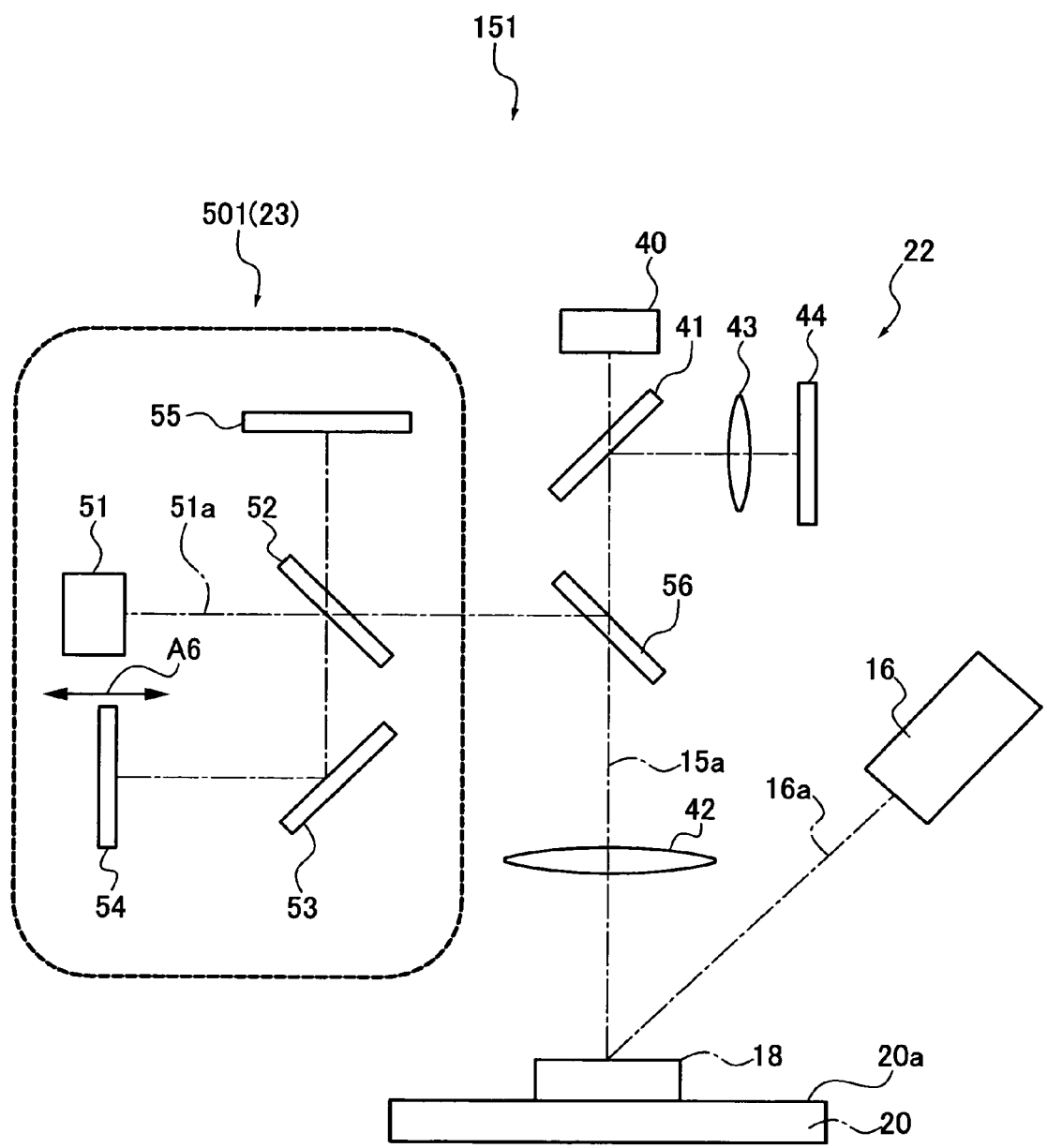
FIG. 8 shows an optical observation system including an interferometer as an optical measurement/observation unit.

FIG. 8 shows an optical observation system 151 which includes an interferometer 501 as the optical measurement/observation unit 23 and is a combination of the optical microscope 22 and the interferometer 501.

The optical microscope 22 comprises a light source 40, a half mirror 41, an objective lens 42, a focus lens 43, and a CCD 44. In the present embodiment a white LED is used for the light source 40. The light source 40, half mirror 41, and objective lens 42 are arranged on the optical axis 15a. The half mirror 41 is inclined at about 45 degrees relative to the optical axis 15a. The CCD 44 (equivalent to the above-described light receiving element 24) is inclined at about 45 degrees relative to the half mirror 41, and disposed so that a line orthogonal to the optical axis 15a is to be a normal line. In the optical microscope 22, the sample 18 is irradiated with a light from the light source 40 via the objective lens 42, a reflected light from the sample 18 is reflected by the half mirror 41 via the objective lens 42 and passes through the focus lens 43, to form an image on the CCD 44. Thereby, the low-magnification image of the sample 18 is obtained as electric signals.

The interferometer 501 comprises a light source 51, half mirrors 52, 56, mirrors 53, 54, and a CCD 55, and co-uses the objective lens 42 with the optical microscope 22. The light source 51 is able to emit light with a predetermined wavelength and is disposed so that its exit optical axis 51a is orthogonal to the optical axis 15a. The half mirror 56 is arranged so as to reflect the light with the single wavelength from the light source 51 to the sample 18 on the optical axis 15a. The half mirror 52 is arranged between the light source 51 and the optical axis 15a on the exit optical axis 51a to reflect the light from the light source 51 in a direction orthogonal to the exit optical axis 51a. The mirror 53 is disposed in the orthogonal direction to reflect the light from the half mirror 52 to the mirror 54 which returns the light from the half mirror 52 to the half mirror 52. The CCD 55 (equivalent to the light receiving element 24) is disposed to face the half mirror 52 with the exit axis 51a in-between.

In the interferometer 501, the half mirror 52 functions to split the light from the light source 51 into two, one to the half mirror 56 and the other to the mirror 53. The light to the half mirror 56 is reflected thereby to reach the sample 18 via the objective lens 42. A reflected light from the sample 18 is reflected by the half mirror 56 and half mirror 52 via the objective lens 42 and directed to the CCD 55. The other light to the mirror 53 is reflected thereby, returned by the mirror 54, reflected by the mirror 53 again, and directed to the CCD 55 via the half mirror 52. The reflected light and returning light (reference light) interfere with each other to generate an interference pattern on the imaging surface of the CCD 55 in accordance with a difference in optical path length between them. Thus, the interferometer can obtain the high-magnification image of the sample 18.

Further, the mirror 54 is slidable in a travel direction (the arrow A6) of the reflected light from the mirror 53 so that the interferometer 501 can measure the height of the sample 18 based on a variation in brightness of the interference pattern due to the sliding of the mirror 54. The control unit 12 slides the mirror 54 via the main board 17, and calculates the height of the sample 18 based on a difference in the optical path length at the slid mirror position between the reflected light and the returning light, intensity of the interference pattern from the CCD 55, and the wavelength of the light from the light source 51.

In the optical observation system 151, the optical microscope 22 and the optical measurement/observation unit 23 (interferometer 501) are switchable each other with the single optical axis 15a, so that the entire system can be downsized. Moreover, the optical observation system 151 in a compact size can obtain different sizes of images of the sample 18, that is, the low-magnification image 30 from the optical microscope 22, the high-magnification image 31 from the interferometer 501 as well as can measure the height of the sample 18 (dimension in the Z direction).

The interferometer 501 according to the present embodiment measures the height of the sample 18 by sliding the mirror 54. However, the present invention is not limited thereto. The dimension of the sample 18 can be measured by moving the table 20 (stage 20a) in the Z direction with the table mover 21 of the slider unit 14.

Figure 9:
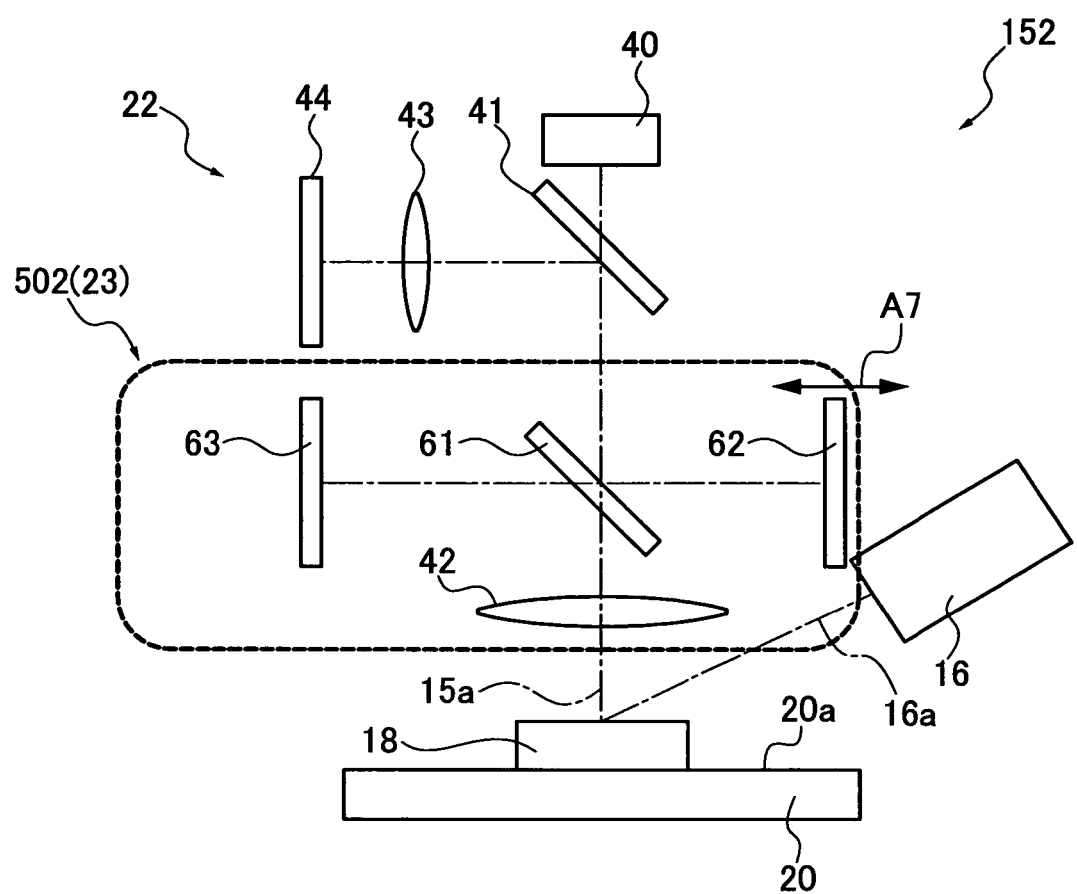
FIG. 9 shows another optical observation system including an interferometer different from the one in FIG. 8 as an optical measurement/observation unit.

Next, an optical observation system 152 different in structure from the optical observation system 151 will be described with reference to FIG. 9. FIG. 9 shows the optical observation system 152 incorporating an interferometer 502 as the optical measurement/observation unit 23.

The optical observation system 152 is a combination of the optical microscope 22 and the interferometer 502. Since the optical microscope 22 is basically structured the same as the optical microscope 22 in FIG. 8, the same elements are given the same codes and a detailed description thereon will be omitted.

The interferometer 502 comprises a dichroic mirror 61, a mirror 62, and a CCD 63, and co-uses the objective lens 42 and the light source 40 with the optical microscope 22. The CCD 63 (equivalent to the light receiving element 24) and the mirror 62 are disposed to face each other in a direction orthogonal to the optical axis 15a, and the dichroic mirror 61 is provided on the optical axis 15a. The dichroic mirror 61 is inclined at 45 degrees relative to the optical axis 15a to reflect the light from the light source 40 to the mirror 62. In the interferometer 502 the light from the light source 40 is split into two by the dichroic mirror 61, one to the mirror 62 and the other to the objective lens 42. The light to the mirror 62 is returned thereby to the CCD 63 via the dichroic mirror 61. The other light passes through the objective lens 42, reaches the sample 18, and a reflected light from the sample 18 is reflected by the dichroic mirror 61 to the CCD 63 via the objective lens 42. The reflected light and returning light (reference light) are interfered with each other and form an interference pattern on an imaging surface of the CCD 63 in accordance with a difference between their respective optical path lengths. Thus, the interferometer 502 can acquire the high-magnification image 31 of the sample 18.

Moreover, the mirror 62 is slidable in a travel direction (the arrow A7) of the reflected light from the dichroic mirror 61 so that the interferometer 502 can measure the height of the sample 18 based on a variation in brightness of the interference pattern due to the sliding of the mirror 62. In the interferometer 502 as in the interferometer 501, the control unit 12 slides the mirror 62 via the main board 17, and calculates the height of the sample 18 based on a difference in the optical path lengths at the slid mirror position between the reflected light and the returning light, intensity of the interference pattern from the CCD 63, and the wavelength of the light transmitted through the dichroic mirror 61.

In the optical observation system 152, the optical microscope 22 and the optical measurement/observation unit 23 (interferometer 502) are switchable each other with the single optical axis 15a, so that the entire system can be downsized.

The interferometer 502 according to the present embodiment measures the height of the sample 18 by sliding the mirror 62. However, the present invention is not limited thereto. The height of the sample 18 can be measured by moving the table 20 (stage 20a) in the Z direction with the table mover 21 of the slider unit 14.

Figure 10:
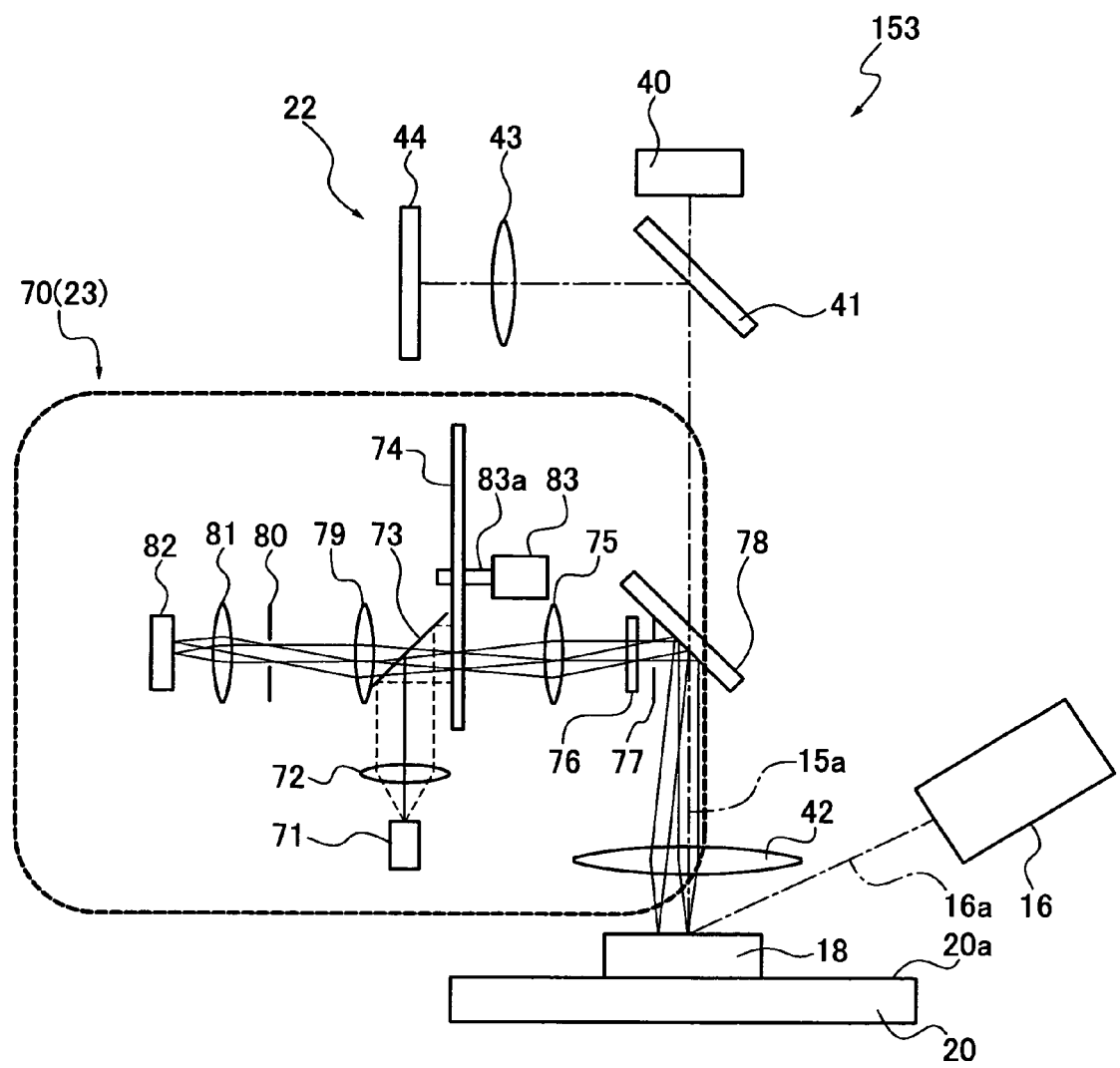
FIG. 10 shows an optical observation system including a confocal microscope as an optical measurement/observation unit.

Next, an optical observation system 153 incorporating a confocal microscope 70 as the optical measurement/observation unit 23 will be described with reference to FIG. 10.

The observation optical axis 153 is a combination of the optical microscope 22 and the confocal microscope 70. The optical microscope 22 is basically structured the same as that in FIG. 8, therefore, the same elements are given the same numeric codes, and a detailed description thereon will be omitted.

The confocal microscope 70 comprises a light source 71, a collimator lens 72, a beam splitter 73, a confocal disc 74, a focus lens 75, a V4 wave plate 76, diaphragms 77, 80, a dichroic mirror 78, lenses 79, 81, and a CCD 82. It co-uses the objective lens 42 with the optical microscope 22.

The collimator lens 72 and the beam splitter 73 are disposed on an optical path of light irradiated from the light source 71. The collimator lens 72 shapes light from the light source 71 into parallel light while the beam splitter 73 reflects the parallel light to the sample 18. The confocal disc 74 is provided on the optical path of the reflection of the beam splitter 73.

The confocal disc 74 has openings (confocal pattern) in such a shape as to attain optical sectioning effect such as a Nipkow disc having a plurality of circular pinholes helically arranged. The center portion of the confocal disc 74 is supported by a rotary axis of a motor 83. The confocal microscope 70 is configured to scan the sample 18 on the stage 20a with the light by rotating the confocal disc 74.

The focus lens 75, $\lambda/4$ wave plate 76, diaphragm 77, and dichroic mirror 78 are arranged on the optical paths of lights having passed through the plurality of openings of the confocal disc 74. The dichroic mirror 78 is disposed on the optical axis 15a to reflect a reflected light from the beam splitter 73 to the objective lens 42 and the sample 18 along the optical axis 15a. The openings of the confocal disc 74 are conjugated with the focal face of the objective lens 42, and the focus lens 75, objective lens 42, and diaphragm 77 constitute a bilateral telecentric system. Also, the light source 71 and diaphragm 77 are conjugated with each other. Note that FIG. 10 shows optical paths of light having passed through two of the plurality of openings of the confocal disc 74.

The reflected light from the sample 18 transmits through the objective lens 42, diaphragm 77, $\lambda/4$ wave plate 76, focus lens 75, confocal disc 74, and beam splitter 73, and the lens 79, diaphragm 80, lens 81, and CCD 82 (equivalent to the light receiving element 24) are arranged on the optical path of light having transmitted through the beam splitter 73. The confocal disc 74 and CCD 82 are conjugated with each other due to the lenses 79, 81, and the lenses 79, 81 and the diaphragm 80 constitute a bilateral telecentric system. The lenses 79, 81 and diaphragm 80 do not have to be a telecentric system; however, it is preferable since it is unlikely to cause a decrease in amount of ambient light, unless the lengths of the intervals between them matter.

A contour image (sectional image) of the sample 18 is formed on the light receiving surface of the CCD 82. The contour image is an image of the outline of a sectional face of the sample sectioned by a plane on the sample side which is in conjugation with the confocal disc 74 when position of the stage 20*a* in the Z direction is secured. The CCD 82 outputs the sectional image as image signals.

The control unit 12 processes the image signals output from the CCD 82 to generate sectional image data and allows the display unit 25 to display it on the display screen 25*a*. Also, the control unit 12 drives the table mover 21 of the slider unit 14 via the main board 17 to move the table 20 (stage 20*a*) in the Z direction.

In the confocal microscope 70, the light from the light source 71 is shaped into parallel light by the collimator lens 72, and reflected by the beam splitter 73 to the sample 18, and illuminates the confocal disc 74 in rotation. Having passed through the openings of the confocal disc 74, the lights are collected on the focus lens 75, transmit through the λ/4 wave plate 76 and diaphragm 77, are reflected by the dichroic mirror 78, and illuminate the sample 18 via the objective lens 42.

The reflected lights from the sample 18 travel backward on the same optical paths, transmit through the beam splitter 73, are incident on the CCD 82 via the lens 79, diaphragm 80 and lens 81. Thereby, a contour image (sectional image) of the sample 18 is formed on the light receiving surface of the CCD 82. The contour image is an image of the outline of a sectional face of the sample sectioned by a plane on the sample side which is in conjugation with the confocal disc 74 when position of the stage 20*a* in the Z direction is secured. Thus, the confocal microscope 70 can generate three-dimensional data of the sample 18 by repeatedly moving the stage 20*a* in the Z direction and performing the above operation.

In the optical observation system 153, the optical microscope 22 and the optical measurement/observation unit 23 (confocal microscope 70) are switchable each other with the single optical axis 15*a*, so that the entire system can be downsized. Moreover, the optical observation system 153 in a compact size can obtain different sizes of images of the sample 18, that is, the low-magnification image 30 from the optical microscope 22 and the high-magnification image 31 from the confocal microscope 70 as well as can measure the height of the sample 18.

Figure 11:
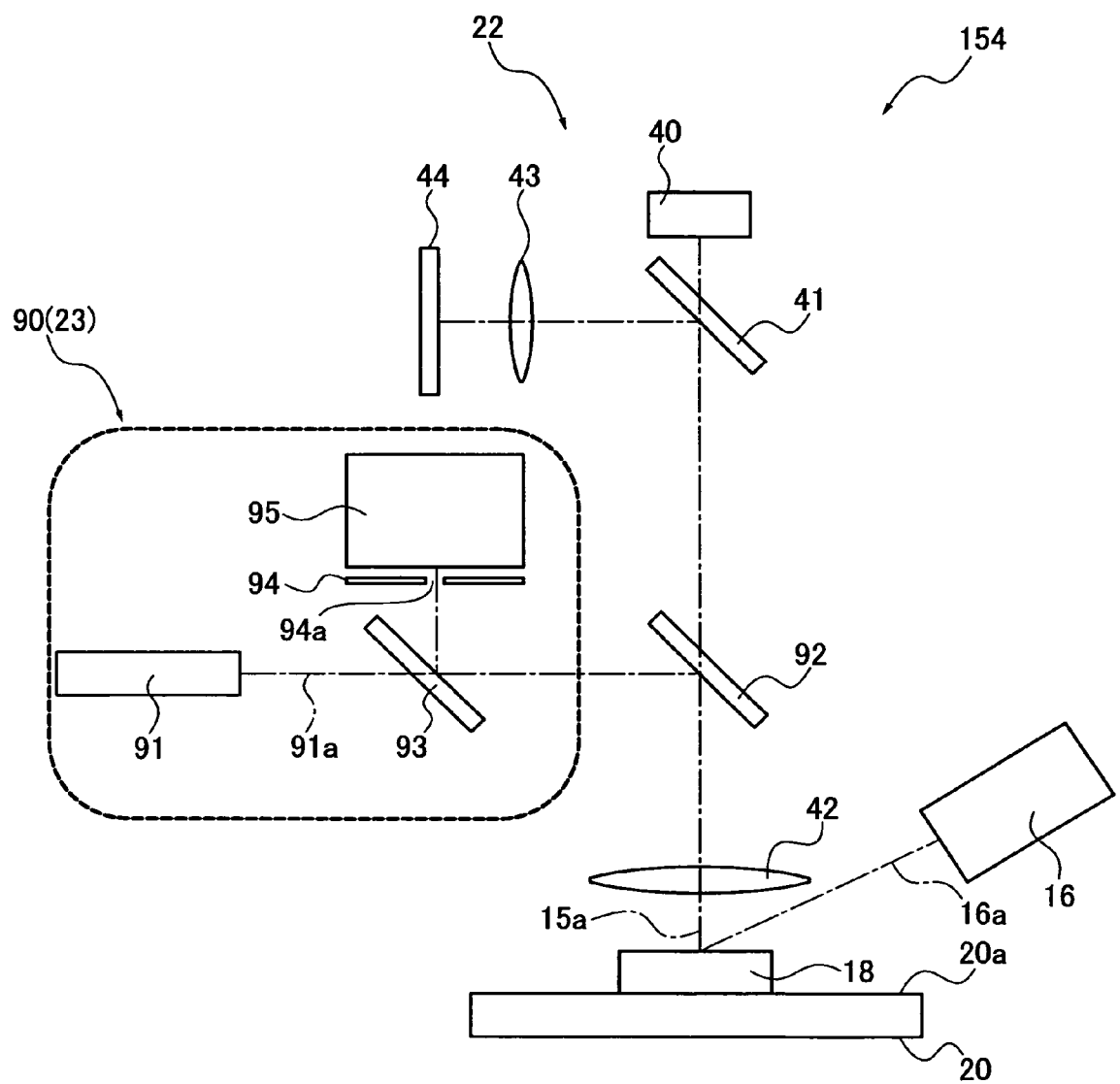
FIG. 11 shows another optical observation system including a laser microscope as an optical measurement/observation unit.

Next, an optical observation system 154 incorporating a laser microscope 90 as the optical measurement/observation unit 23 will be described with reference to FIG. 11.

The optical observation system 154 is a combination of the optical microscope 22 and the laser microscope 90. Since the optical microscope 22 is basically structured the same as the optical microscope 22 in FIG. 8, the same elements are given the same codes and a detailed description thereon will be omitted.

The laser microscope 90 comprises a laser light source 91, a dichroic mirror 92, a beam splitter 93, a pinhole element 94, and an optical detector 95 (equivalent to the light receiving element 24), and co-uses the objective lens 42 with the optical microscope 22. The laser light source 91 emits laser light under the control of the control unit 12, and the dichroic mirror 92 is disposed on the optical axis 15*a* to reflect the laser light to the objective lens 42 and the sample 18.

The beam splitter 93 is provided between the dichroic mirror 92 and the laser light source 91 and inclined at 45 degrees relative to an exit optical axis 91*a* of the laser light source 91. The pinhole element 94 and the optical detector 95 are arranged in a direction in which the light is reflected by the beam splitter 93. The pinhole element 94 forms an opening 94*a* which is conjugated with the focal point of the objective lens 42.

The optical detector 95 comprises a photomultiplier tube (PMT), a current/voltage converting circuit, an A/D converter to detect power of later-described fluorescent light. The PMT converts power of fluorescent light having passed through the pinhole element 94 into electric current. The control unit 12 drives the table mover 21 of the slider unit 14 via the main board 17 to move the stage 20*a* along the XY plane in the Z direction. Thus, the control unit 12 processes the fluorescent light detected by the optical detector 95 to generate an SEM image, and allow the display unit 25 to display it on the display screen 25*a*.

In the laser microscope 90, the laser light source 91 is set to emit laser light with a predetermined wavelength and power. The laser light passes through the beam splitter 93 and is reflected by the dichroic mirror 92 to irradiate the sample 18 via the objective lens 42.

Irradiated with laser light, the sample 18 emits fluorescent light at brightness in accordance with power of the laser light with a different wavelength from that of the laser light. The fluorescent light passes through the objective lens 42 and is reflected by the dichroic mirror 92 and the beam splitter 93 and directed to the pinhole element 94 and the optical detector 95. Having passed through the opening 94*a* of the pinhole element 94, the fluorescent light is detected by the optical detector 95 which transmits a detection signal of a level corresponding to power of the fluorescent light to the control unit 12. Under the control of the control unit 12, detection signals are arranged according to the position of the table 20 (stage 20*a*) moved in the XY plane in the Z direction to form a three-dimensional fluorescent image (high-magnification image 31).

In the optical observation system 154, the optical microscope 22 and optical measurement/observation unit 23 (laser microscope 90) are switchable with the single optical axis 15*a*, so that the entire system can be downsized. Accordingly, the optical observation system 151 in a compact size can obtain different sizes of images of the sample 18, that is, the low-magnification image 30 from the optical microscope 22 and the high-magnification image 31 from the laser microscope 90 as well as can measure the height of the sample 18.

Although the sample 18 on the stage 20*a* is scanned with the laser light by moving the table 20 along the XY plane in the laser microscope 90, it can be scanned in another manner. For example, between the dichroic mirror 92 and objective lens 42*a* on the optical axis 15, a not-shown scanner unit can be provided to scan the sample with laser light in two (X and Y) directions orthogonal to the optical axis 15*a*. Such a scanner unit can be configured to scan with the laser light in the two directions by changing the inclination angle of the dichroic mirror or it can be configured of an acousto-optic device using an acousto-optical effect in which laser light is diffracted, given frequency-modulated ultra sonic waves.

Now, an example of observing a sample with the complex type microscopic device 10 will be described with reference to FIGS. 12 to 14.

Figure 12:
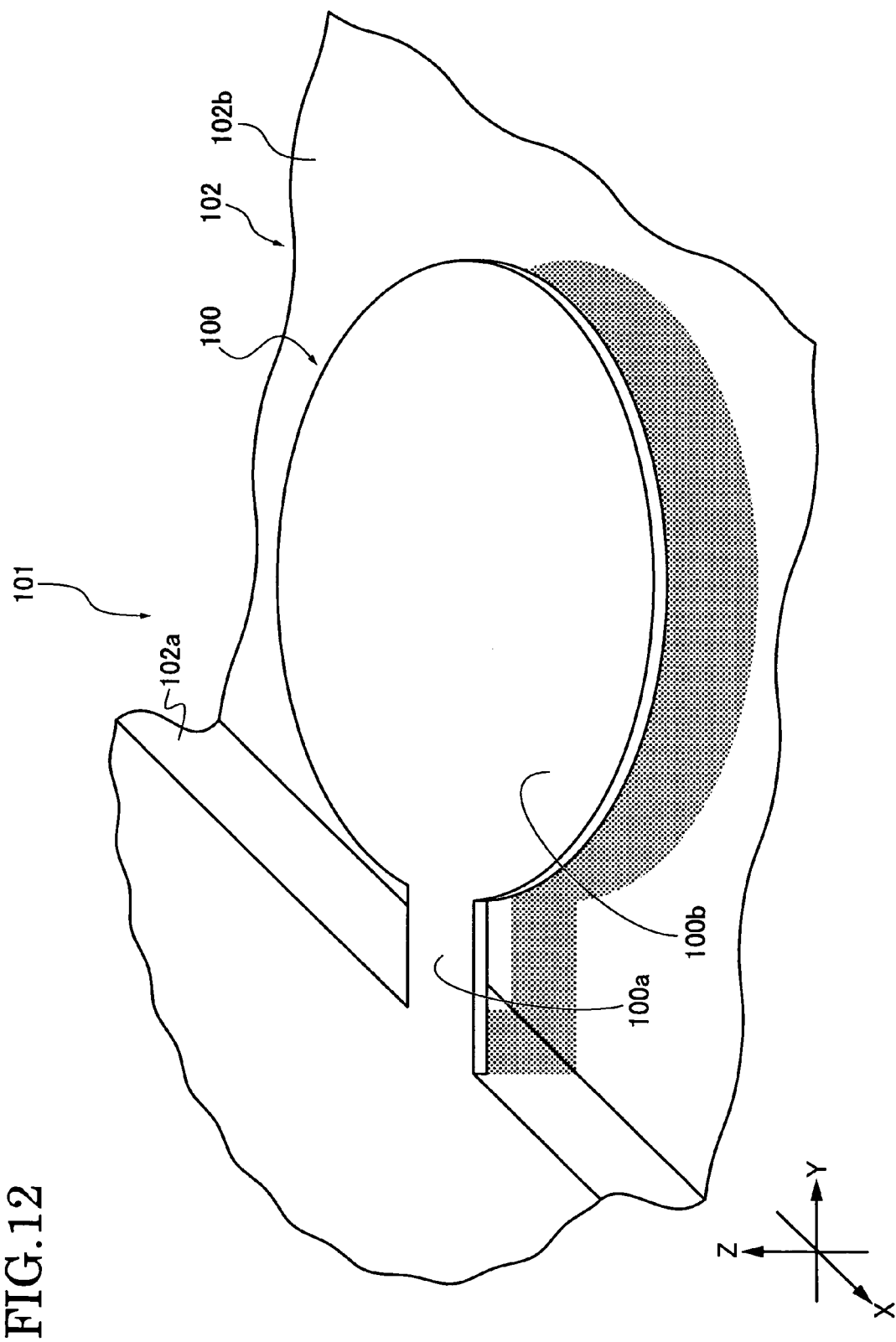
FIG. 12 schematically shows a MEMS mirror.
Figure 13:
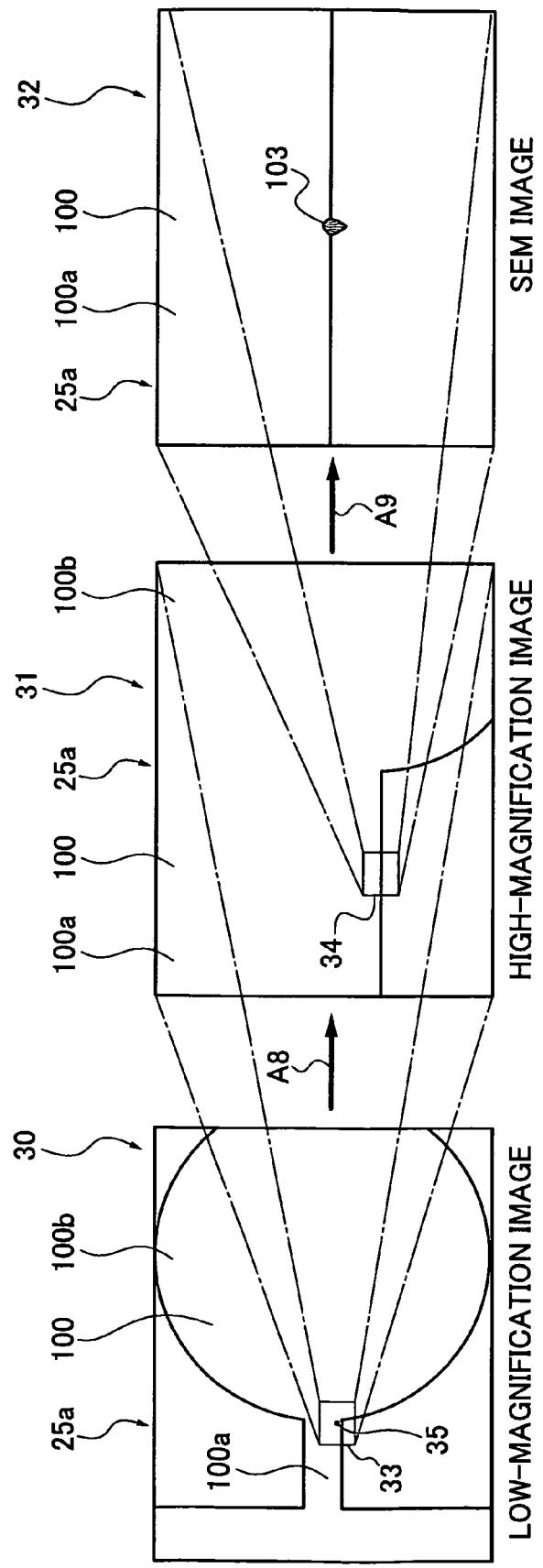
FIG. 13 shows how a MEMS mirror is observed with the complex type microscopic device according to the present invention as an example of observing an image on a display screen.
Figure 14:
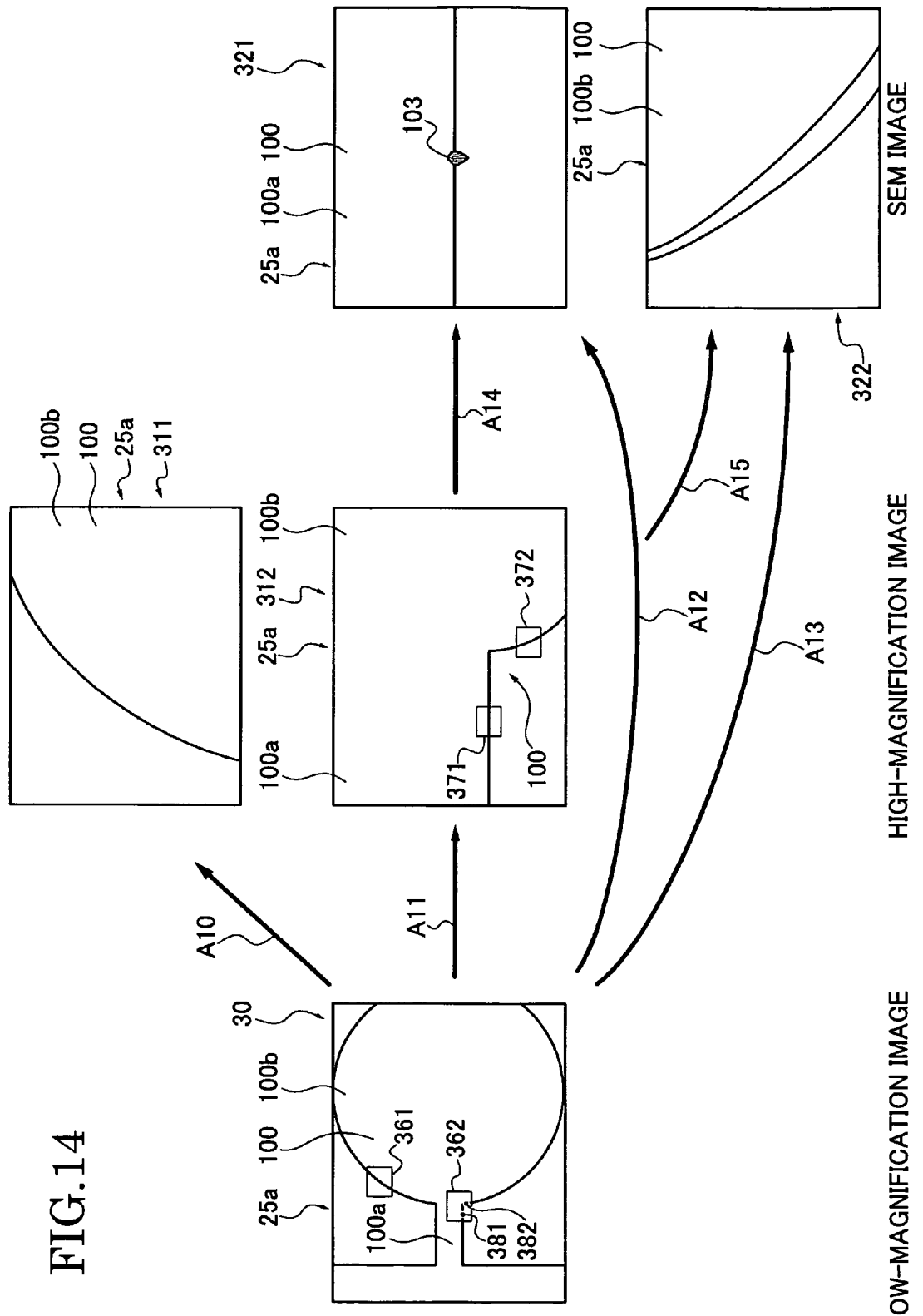
FIG. 14 shows display of previously observed images on the display screen.

FIG. 12 schematically shows a micro electro mechanical system (MEMS) mirror 100, FIG. 13 shows how an image of the MEMS mirror 100 is observed on the display screen 25*a* of the complex type microscopic device 10, and FIG. 14 shows how stored images are displayed on the display screen 25*a*.

In the present embodiment the complex type microscopic device 10 is used to inspect the MEMS mirror 100 by way of example. The MEMS mirror 100 is provided in a concavity 102 of a board 101 as shown in FIG. 12. A base portion 100a thereof continues into a sidewall 102a of the concavity 102 and a mirror portion 100b extends from the base portion 100a to be parallel with a bottom wall 102b of the concavity 12. The mirror portion 100b of the MEMS mirror 100 is vertically tilted, given an electric signal (not shown).

First, the complex type microscopic device 10 is activated. The MEMS mirror 100 is placed on the stage 20a, a not-shown door of the specimen chamber 13 is closed, and sample setting is completed through manipulation with the operation unit 26. Following the steps S1 to S3, a low-magnification image 30 of the MEMS mirror 100 is obtained with the optical microscope 22 and displayed on the display screen 25a for observation.

Then, according to a user's operation, the low-magnification image 30 is stored and the low-magnification frame 33 and/or SEM point 35 is/are displayed. The low-magnification frame 33 is moved to an arbitrary position (designated position d1 in FIG. 2) and selected. The complex type microscopic device 10 performs control processing in steps S13 to S16 after steps S4 to S12 and proceeds to observation by the optical measurement/observation unit 23 (process A) and performs processing in steps S18 and S19, and displays the high-magnification image 31 of the MEMS mirror 100 on the display screen 25a (the arrow A8 in FIG. 13).

The high-magnification image 31 of the MEMS mirror 100 from the optical measurement/observation unit 23 is observed on the display screen 25a.

Then, the height of the MEMS mirror 100 is measured, the high-magnification image 31 is stored, and the high-magnification frame 34 is displayed. When the high-magnification frame 34 is moved to an arbitrary position (designated position d2 in FIG. 2), and selected at the designated position d2, the complex type microscopic device 10 performs control processing in steps S20 to S23, S30 to S33, then proceeds to observation by the SEM 16 (process B) in steps S34, S35, S37, and displays the SEM image 32 of the MEMS mirror 100 from the SEM 16 on the display screen 25a (the arrow A9 in FIG. 13).

The SEM image 32 of the MEMS mirror 100 from the SEM 16 is observed on the display screen 25a. By observing the SEM image 32, it is able to find a defect 103 which otherwise could not be found on the low-magnification image 30 and the high-magnification image 31, for example.

Through repetition of the above operation, the complex type microscopic device 10 stores the low-magnification image 30, high-magnification image 31 and data on the height of the MEMS mirror 100, and SEM image 32 in the storage 27.

Upon receiving an instruction to display the associated low-magnification frame 36 and associated SEM point 38 during display of the low-magnification image 30 on the display screen 25a, the complex type microscopic device 10 performs control processing in steps S4 to S6 to display the associated low-magnification frame 36 and associated SEM point 38 on the low-magnification image 30 at respective positions corresponding to positions of the stored high-magnification image 31 and SEM image 32, as shown in FIG. 14. FIG. 14 shows an example of displaying two associated low-magnification frames 361, 362 and two associated SEM points 381, 382.

Upon the associated low-magnification frame 36 being selected, the complex type microscopic device 10 performs control processing in steps S8, S9 to display the high-magnification image 31 corresponding to the selected associated low-magnification frame 36 on the display screen 25a. Upon the associated SEM point 38 being selected, the complex type microscopic device 10 performs control processing in steps S11, S12 to display the SEM image 32 corresponding to the selected associated SEM point 38 on the display screen 25a.

In FIG. 14, when the associated low-magnification frame 361 is selected, a high-magnification image 311 is displayed on the display screen 25a (the arrow A10) while when the associated low-magnification frame 362 is selected, a high-magnification image 312 is displayed thereon (the arrow A11). Similarly, when the associated SEM point 381 is selected, an SEM image 321 is displayed on the display screen 25a (the arrow 12) while the associated SEM point 382 is selected, an SEM image 322 is displayed on the display screen 25a (the arrow 13).

Further, upon receiving an instruction to display the associated SEM point 38 on the display screen 25a during display of the high-magnification image 13, the complex type microscopic device 10 performs control processing in steps S23 to S25 to display the associated high-magnification frame 37 on the high-magnification image 31 on the display screen 25a at a position corresponding to that of the stored SEM image 32 in the storage 27, as shown in FIG. 4. FIG. 14 shows an example of displaying two associated high-magnification frames 371, 372 corresponding to the associated SEM point 381, 382.

Upon the associated high-magnification frame 37 being selected, the complex type microscopic device 10 performs control processing in steps S26 to S28 to display the SEM image 32 corresponding to the selected associated high-magnification frame 37 on the display screen 25a.

In FIG. 14, when the associated high-magnification frame 371 is selected, an SEM image 321 is displayed on the display screen 25a (the arrow A14) while when the associated high-magnification frame 372 is selected, an SEM image 322 is displayed thereon (the arrow A15).

As described above, with the complex type microscopic device 10, it is able to designate an arbitrary position of the low-magnification image 30 from the optical microscope 22 using the low-magnification frame 33 to display the image from the optical measurement/observation unit 23 and to obtain the high-magnification image 31 at the designated position. Also, it is able to designate an arbitrary position of the high-magnification image 31 from the optical measurement/observation unit 23 using the high-magnification frame 34 to display the image from the SEM 16 and to obtain the SEM image 32 at the designated position.

Thus, with provision of the optical measurement/observation unit 23 with the intermediate magnification between those of the optical microscope 22 and the SEM 16, the complex type microscopic device 10 can switch the image on the display screen from the low-magnification image 30 from the optical microscope 22 to the high-magnification image 31 from the optical measurement/observation unit 23 and from the high-magnification image 31 to the SEM image 32 from the SEM 16 in accordance with positional data on the respective images. Accordingly, it is able to easily, properly observe an arbitrary position of the image from the optical microscope 22 with the SEM 16.

Further, the complex type microscopic device 10 comprises the three microscopic units with different magnifications from one another which are disposed so that the optical axis 15a of the observation system 15 and the electron axis 16a of the SEM 16 intersect with each other at the reference position (center) on the stage 20a. This can decrease a moving amount of the stage 20a to a very small value. Accordingly, this makes it possible to form the slider unit 14 which can precisely move the stage 20a at a level matching with the magnification of the SEM 16 without increasing manufacturing cost unlike a mechanism for moving it between two distant points.

Moreover, in the complex type microscopic device 10, the optical measurement/observation unit 23 can measure the height of the sample 18 (dimension in the Z direction) and associate a captured high-magnification image 31 with data on the height. The data on the height can be reflected in the low-magnification image 30 and SEM image 32 since positions of both of the images are associated with those of the high-magnification image 31. Therefore, the complex type microscopic device 10 can three-dimensionally observe the sample 18 by adding the height data to data of the two-dimensional images expressed in shades from the optical microscope 22 and the SEM 16.

While displaying an image on the display screen 25a, the complex type microscopic device 10 can display the low-magnification frame 33, high-magnification frame 34, and SEM point 35 to display another stored image from another microscope, which allows a user to easily recognize presence of another image related to the image on the display visually. Accordingly, it is possible to prevent the high-magnification image 31 and the SEM image 32 of the same area of the sample 18 from being obtained twice and realize efficient observation of the sample 18.

In switching the optical measurement/observation unit 23 to the SEM 16, the complex type microscopic device 10 take the height of the sample 18 at the designated position d2 into account to move the table 20 (stage 20a) in the Z direction so that the designated position d2 of the sample 18 is located on the electron axis 16a. Therefore, it can properly observe the designated position d2 of the sample 18 with the SEM 16 irrespective of magnitude of the height of the sample.

For observation of a sample 18 in a large height, it may not be able to properly observe the designated position d2 of the sample 18 by moving the stage 20a along the XY plane because of the inclination of the electron axis 16a of the SEM 16 relative to the optical axis 15a of the observation unit 15.

In order to prevent this, the complex type microscopic device 10 is configured to designate a position of the low-magnification image 30 on the display screen 25a with the SEM point 35 and observe the SEM image 32 at the designated position with the SEM 16. It is therefore possible to directly switch the low-magnification image 30 to the SEM image 32 on the display screen without displaying the high-magnification image 31 when accurate designation of a position is not needed.

Moreover, the complex type microscopic device 10 comprises the optical microscope 22 and optical measurement/observation unit 23 of the optical observation system 15 which have the same optical axis and share same objective lens 42. Further, the optical axis 15a of the optical observation system 15 is set to intersect with the electron axis 16a of the SEM 16. This eliminates necessity for making the axes of the three different microscopic units coincide with one another, makes it easier to form the device 10 and achieves downsizing of the entire device.

Accordingly, the complex type microscopic device 10 according to the present invention can easily designate an arbitrary position on the display screen and easily, properly switch the unit to observe the sample 18 from the optical microscope 22 to the optical measurement/observation unit 23, from the optical measurement/observation unit 23 to the SEM 16. It can also properly observe an arbitrary position of an image from the optical microscope 22 with the SEM 16.

Moreover, according to the present embodiment, the control unit 12 controls the slider unit 14 to move the stage 20a by an amount obtained by converting a direction and an interval between two arbitrary points on the display screen 25a into a direction and an interval on the stage 20a. This makes it possible to designate an arbitrary position on the display screen 25a and accurately associate an arbitrary area of the low-magnification image 30 with a corresponding area of the SEM image 32.

Second Embodiment

Now, another example of a complex type microscopic device according to the present embodiment will be described. A difference from the complex type microscopic device 10 is in the low-magnification frame and high-magnification frame displayed on the display screen 25a of the display unit 25. The basic structure of this complex type microscopic device is the same as that of the complex type microscopic device 10 so that the same components will be given the same numeric codes, and a detailed description thereon will be omitted.

In the present embodiment, the size of the low-magnification frame 33 is changeable on the low-magnification image 30, and so is the size of the high-magnification frame 34 on the high-magnification image 31 while in the first embodiment the size of the low-magnification frame 33 on the low-magnification image 30 is fixed to a certain size matching with an image observed at a magnification of the optical measurement/observation unit 23 and that of the high-magnification frame 34 on the high-magnification image 31 is set to a certain size matching with an image observed at a magnification of the SEM 16. Thus, the low-magnification and high-magnification frames can be arbitrarily configured as long as it is easy to designate an observing position of the optical measurement/observation unit 23 on the low-magnification image 30 as well as to designate an observing position of the SEM 16 on the high-magnification image 31, respectively.

Figure 15:
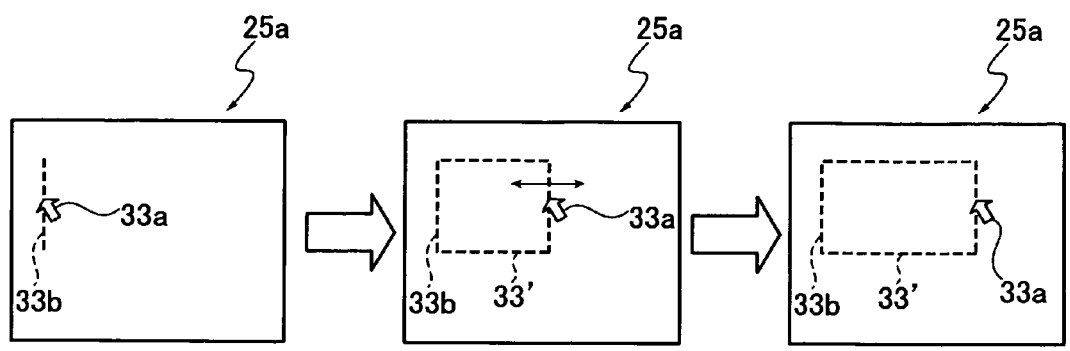
FIG. 15 shows display of a low-magnification frame according to a second embodiment.
Figure 16:
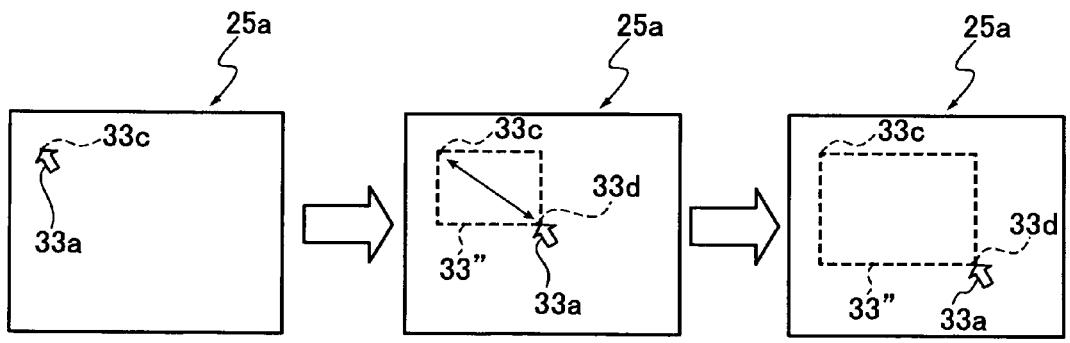
FIG. 16 shows display of another low-magnification frame different from the one in FIG. 15.

FIG. 15 shows a low-magnification frame 33' on the low-magnification image 30 and FIG. 16 shows another low-magnification frame 33" by way of example. In FIGS. 15, 16 the low-magnification image is partially enlarged for better understanding of the size changeable low-magnification frame. Note that a description on the high-magnification frame will be omitted since the function thereof is basically the same as that of the low-magnification frame.

As shown in the leftmost drawing in FIG. 15, upon receipt of an instruction to display the low-magnification frame 33', first, a pointer 33a is shown up on the low-magnification image 30. The pointer 33a is movable to an arbitrary position by manipulating the operation unit 26, and used for setting the position and size of the low-magnification frame 33' on the low-magnification image 30.

When an arbitrary position is designated with the pointer 33a, a line segment 33b is shown up and extends vertically (longitudinally on the display screen 25a) from the designated position as a center, as shown in the leftmost display screen 25a. In the present embodiment, the length of the line segment 33b is set to coincide with the vertical length of the image from the optical measurement/observation unit 23. The line segment 33b functions to set an end position of the low-magnification frame 33' on the low-magnification image 30.

By moving pointer 33a from the line segment 33b as a starting point, a rectangular low-magnification frame 33' appears on the low-magnification image 30, including the line segment 33b as one side and being changeable in length horizontally, as shown in the middle and rightmost drawings. The horizontal length of the frame 33' is adjustable by manipulating the operation unit 26. In the present embodiment, it is adjustable in a range smaller than the horizontal length of the image from the optical measurement/observation unit 23. That is, when the low-magnification frame 33' is enlarged to match with the image from the optical measurement/observation unit 23 in size, the size of the low-magnification frame 33' on display can no longer enlarged by even moving the pointer 33a to enlarge it. The low-magnification frame 33' is set on the low-magnification image 30 from the starting point by moving the pointer 33a to designate an arbitrary ending point.

Thus, the low-magnification frame 33' is set to be in a rectangular shape on the low-magnification image 30 by moving the pointer 33a to arbitrarily designate the starting point (position of the line segment 33b) and ending point (length).

When the low-magnification frame 33' is selected, the high-magnification image 31 with a center matching with that of the low-magnification frame 33' is displayed on the display screen 25a. The displayed high-magnification image 31 is an image obtained by observing with the optical measurement/observation unit 23 a rectangular area whose vertical direction matches with the vertical side (line segment 33b) of the low-magnification frame 33' and center in the horizontal direction is that of the horizontal side thereof. The low-magnification frame 33' is not limited to the example in FIG. 15. The line segment as the starting point can be horizontal in addition to vertical.

Likewise, in the leftmost drawing of FIG. 16, upon receipt of an instruction to display a low-magnification frame 33" via the operation unit 26, the pointer 33a appears on the low-magnification image 30. By moving the pointer 33a on the low-magnification image 30, an arbitrary position is designated as a starting point 33c. By further moving the pointer 33a, a rectangular low-magnification frame 33" having the current position of the pointer 33a and the starting point 33c as opposing corners appears as shown in the middle and rightmost drawings. This rectangular low-magnification frame 33" has the fixed starting point 33c and horizontal to vertical ratio and size thereof are changeable in accordance with the position of the pointer 33a. In the present embodiment the lengths of the vertical and horizontal sides of the low-magnification frame 33" are adjustable on the low-magnification image 30 in a range smaller than those of the image from the optical measurement/observation unit 23. That is, when either of the vertical and horizontal sides of the low-magnification frame 33" becomes equal to those of the image from the optical measurement/observation unit 23, the vertical and horizontal sides of the displayed low-magnification frame 33' can be no longer increased by even moving the pointer 33a to enlarge the frame 33'. By moving the pointer 33a to arbitrarily designate an end point 33d, the rectangular low-magnification frame 33" having the starting and end point 33c, 33d as opposing corners is set on the low-magnification image 30. The low-magnification frame 33" functions the same as the low-magnification frame 33' in FIG. 15.

With use of a mouse for the operation unit 26, the positions and sizes of the low-magnification frames 33', 33" are easily adjustable by a simple drag and drop to set the starting and end points.

Since the position and size of the low-magnification frame according to the present embodiment is adjustable on the low-magnification image 30 (high-magnification image 31) by manipulating the operation unit 26, it makes easier to designate an observation area of the optical measurement/observation unit 23 (SEM 16) on the low-magnification image 30 (high-magnification image 31).

Moreover, the low-magnification frame according to the present embodiment is set not to be larger than the image from the optical measurement/observation unit 23 (SEM 16) on the low-magnification image 30 (high-magnification image 31). This can prevent a user from misunderstanding the observed position and size of the image from the optical measurement/observation unit 23 (SEM 16).

Furthermore, according to the present embodiment, the low-magnification frame on the low-magnification image 30 (high-magnification image 31) can be enlarged up to the size of the image from the optical measurement/observation unit 23 (SEM 16). For switching the optical microscope 22 to the optical measurement/observation unit 23 (SEM 16), it is able to decide an observing position, learning the size of an image observed at a magnification of the optical measurement/observation unit 23 (SEM 16). When the size is already known, it is also possible to simply decide an observing position.

The above embodiments have described an example in which a control process of the device is performed according to the flowcharts in FIG. 5 to FIG. 7. However, the present invention is not limited thereto. It can be performed arbitrarily as long as the optical microscope 22, optical observation system 15 and SEM 16 are switchable for observation and the display of the stored low-magnification image, high-magnification image, SEM image are switchable as shown in FIG. 13, 14.

Moreover, the above embodiments have described an example of using the low-magnification frame 33, SEM point 35, and high-magnification frame 34. However, the present invention is not limited thereto. Any arbitrary representations are usable as long as they can distinctively represent respective display areas of the optical measurement/observation unit 23, and SEM 16 on the low-magnification image 30 and high-magnification image 31.

Furthermore, the above embodiments have described an example of using the confocal microscope 70, laser microscope 90, and interferometers 501, 502 for the optical measurement/observation unit 23. However, the optical measurement/observation unit can be structured by another method such as a triangulation method or an astigmatic difference method as long as it has an intermediate magnification between those of the optical microscope 22 and the SEM 16 and it co-uses the objective lens 42 with the optical microscope 22.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. A complex type microscopic device comprising:
   a slider unit which moves, along a horizontal plane, a stage on which a sample is placed;
   an optical microscope which has an optical axis parallel to a vertical direction in an area in which the stage is moved by the slider unit;
   a scanning electron microscope which has an electron axis intersecting with the optical axis on the stage;
   an optical measurement/observation unit having a magnification intermediate between magnifications of the scanning electron microscope and the optical microscope, and co-using an objective lens with the optical microscope;

a control unit which generates an image from image data on the sample obtained with each of the optical measurement/observation unit, the scanning electron microscope, and the optical microscope, and which controls the slider unit to move the stage; and a display unit which includes a display screen on which the image is displayed under control of the control unit, wherein:

during display of a low-magnification optical microscopic image obtained with the optical microscope on the display screen, the control unit controls the display unit to display, on the low-magnification optical microscopic image, a first representation to designate an area to be observed at the magnification of the optical measurement/observation unit; and during display of a high-magnification optical microscopic image obtained with the optical measurement/observation unit on the display screen, the control unit controls the display unit to display, on the high-magnification optical microscopic image, a second representation to designate an area to be observed at the magnification of the scanning electron microscope.

2. A complex type microscopic device according to claim 1, wherein the control unit controls the slider unit to move the stage by an amount obtained by converting a direction and an interval between two arbitrary points on the display screen into a direction and an interval on the stage.

3. A complex type microscopic device according to claim 1, further comprising:

an instruction element with which an arbitrary position on the display screen can be designated and which gives an instruction to switch among the optical microscope, the optical measurement/observation unit, and the scanning electron microscope, wherein during the display of the low-magnification optical microscopic image on the display screen, when an arbitrary position is designated with the instruction element, the control unit controls the display unit to display the first representation on the low-magnification optical microscopic image in such a manner that a center of the first representation is to be the designated position, and when the instruction element instructs to switch the optical microscope to the optical measurement/observation unit, the control unit controls the slider unit to move the stage so that the designated position is located on the optical axis, to display the high-magnification optical microscopic image on the display screen.

4. A complex type microscopic device according to claim 2, further comprising:

an instruction element with which an arbitrary position on the display screen can be designated and which gives an instruction to switch among the optical microscope, the optical measurement/observation unit, and the scanning electron microscope, wherein during the display of the low-magnification optical microscopic image on the display screen, when an arbitrary position is designated with the instruction element, the control unit controls the display unit to display the first representation on the low-magnification optical microscopic image in such a manner that a center of the first representation is to be the designated position, and when the instruction element instructs to switch the optical microscope to the optical measurement/observation unit, the control unit controls the slider unit to move the stage so that the designated position is located on the optical axis, to display the high-magnification optical microscopic image on the display screen.

5. A complex type microscopic device according to claim 1, further comprising:

an instruction element with which an arbitrary position on the display screen can be designated and which gives an instruction to switch among the optical microscope, the optical measurement/observation unit, and the scanning electron microscope, wherein during the display of the high-magnification optical microscopic image on the display screen, when an arbitrary position is designated with the instruction element, the control unit controls the display unit to display the second representation on the high-magnification optical microscopic image in such a manner that a center of the second representation is to be the designated position, and when the instruction element instructs to switch the optical measurement/observation unit to the scanning electron microscope, the control unit controls the slider unit to move the stage so that the designated position is located on the optical axis, to display an electron microscopic image from the scanning electron microscope on the display screen.

6. A complex type microscopic device according to claim 2, further comprising:

an instruction element with which an arbitrary position on the display screen can be designated and which gives an instruction to switch among the optical microscope, the optical measurement/observation unit, and the scanning electron microscope, wherein during the display of the high-magnification optical microscopic image on the display screen, when an arbitrary position is designated with the instruction element, the control unit controls the display unit to display the second representation on the high-magnification optical microscopic image in such a manner that a center of the second representation is to be the designated position, and when the instruction element instructs to switch the optical measurement/observation unit to the scanning electron microscope, the control unit controls the slider unit to move the stage so that the designated position is located on the optical axis, to display an electron microscopic image from the scanning electron microscope on the display screen.

7. A complex type microscopic device according to claim 1, wherein during display of the low-magnification optical microscopic image on the display screen, the control unit controls the display unit to display, on the first representation, a third representation to designate an area to be observed at the magnification of the scanning electron microscope in such a manner that the third representation is located at a center of the first representation.

8. A complex type microscopic device according to claim 1, further comprising a storage unit in which the low and high-magnification optical microscopic images and the electron microscopic image are stored, wherein the control unit allows the low-magnification optical microscopic image displayed on the display screen to be stored in the storage unit, allows the high-magnification optical microscopic image displayed on the display screen to be stored in the storage unit along with positional data of the low-magnification optical microscopic image, and allows the electron microscopic image displayed on the display screen to be stored in the storage unit along with positional data of the low-magnification optical microscopic image and the high-magnification optical microscopic image.

9. A complex type microscopic device according to claim 1, wherein
the optical measurement/observation unit is able to measure a height of the sample.

\* \* \* \* \*